(12) United States Patent
Fiolka et al.

(10) Patent No.: US 8,482,717 B2
(45) Date of Patent: Jul. 9, 2013

(54) POLARIZATION-MODULATING OPTICAL ELEMENT

(75) Inventors: Damian Fiolka, Oberkochen (DE); Markus Deguenther, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 12/201,767

(22) Filed: Aug. 29, 2008

(65) Prior Publication Data

US 2008/0316459 A1     Dec. 25, 2008

Related U.S. Application Data

(63) Continuation of application No. 11/440,475, filed on May 25, 2006, now abandoned, which is a continuation-in-part of application No. PCT/EP2005/000320, filed on Jan. 14, 2005.

(60) Provisional application No. 60/537,327, filed on Jan. 16, 2004, provisional application No. 60/684,607, filed on May 25, 2005.

(51) Int. Cl.
*G03B 27/42*     (2006.01)

(52) U.S. Cl.
USPC ............... 355/67; 355/71; 355/53; 359/303; 359/352; 359/437

(58) Field of Classification Search
USPC .............................. 355/53, 67, 71
See application file for complete search history.

(56) References Cited

U.S. PATENT DOCUMENTS

| | | |
|---|---|---|
| 2,473,857 A | 6/1949 | Burchell |
| 3,438,692 A | 4/1969 | Tabor |

(Continued)

FOREIGN PATENT DOCUMENTS

| | | |
|---|---|---|
| CN | 1270326 A | 10/2000 |
| DE | 28 05 732 A1 | 8/1978 |

(Continued)

OTHER PUBLICATIONS

Hecht, Optics, Pearson Education Inc. Fourth Edition, 348-349, 2002.

(Continued)

*Primary Examiner* — Toan Ton
*Assistant Examiner* — Mesfin T Asfaw
(74) *Attorney, Agent, or Firm* — Fish & Richardson P.C.

(57) ABSTRACT

The invention relates to a projection system, comprising a radiation source, an illumination system operable to illuminate a structured mask, and a projection objective for projecting an image of the mask structure onto a light-sensitive substrate, wherein said projection system comprises an optical system comprising an optical axis or a preferred direction given by the direction of a light beam propagating through the optical system; the optical system comprising a temperature compensated polarization-modulating optical element described by coordinates of a coordinate system, wherein one preferred coordinate of the coordinate system is parallel to the optical axis or parallel to said preferred direction; said temperature compensated polarization-modulating optical element comprising a first and a second polarization-modulating optical element, the first and/or the second polarization-modulating optical element comprising solid and/or liquid optically active material and a profile of effective optical thickness, wherein the effective optical thickness varies at least as a function of one coordinate different from the preferred coordinate of the coordinate system, in addition or alternative the first and/or the second polarization-modulating optical element comprises solid and/or liquid optically active material, wherein the effective optical thickness is constant as a function of at least one coordinate different from the preferred coordinate of the coordinate system; wherein the first polarization-modulating optical element comprises optically active material with a specific rotation of opposite sign compared to the optically active material of the second polarization-modulating optical element.

24 Claims, 15 Drawing Sheets

U.S. PATENT DOCUMENTS

| | | |
|---|---|---|
| 3,484,714 A | 12/1969 | Koester et al. |
| 3,630,598 A | 12/1971 | Little, Jr. |
| 3,719,415 A | 3/1973 | Rawson |
| 3,758,201 A | 9/1973 | MacNeille |
| 3,892,469 A | 7/1975 | Lotspeich |
| 3,892,470 A | 7/1975 | Lotspeich |
| 3,957,375 A | 5/1976 | Hadeishi |
| 4,175,830 A * | 11/1979 | Marie ............................ 359/484 |
| 4,235,517 A | 11/1980 | Marie |
| 4,272,158 A | 6/1981 | Johnston, Jr. et al. |
| 4,286,843 A | 9/1981 | Reytblatt |
| 4,370,026 A | 1/1983 | Dubroeucq et al. |
| 4,712,880 A | 12/1987 | Shirasaki |
| 4,744,615 A | 5/1988 | Fan et al. |
| 4,755,027 A | 7/1988 | Schafer |
| 5,253,110 A | 10/1993 | Ichihara et al. |
| 5,300,972 A | 4/1994 | Kamon |
| 5,345,292 A | 9/1994 | Shiozawa et al. |
| 5,365,371 A | 11/1994 | Kamon |
| 5,382,999 A | 1/1995 | Kamon |
| 5,436,761 A | 7/1995 | Kamon |
| 5,442,184 A | 8/1995 | Palmer et al. |
| 5,453,814 A | 9/1995 | Aiyer |
| 5,459,000 A | 10/1995 | Unno |
| 5,471,343 A * | 11/1995 | Takasugi ........................ 359/494 |
| 5,475,491 A | 12/1995 | Shiozawa |
| 5,541,026 A | 7/1996 | Matsumoto |
| 5,559,583 A | 9/1996 | Tanabe |
| 5,621,498 A | 4/1997 | Inoue et al. |
| 5,627,626 A | 5/1997 | Inoue et al. |
| 5,663,785 A | 9/1997 | Kirk et al. |
| 5,673,103 A | 9/1997 | Inoue et al. |
| 5,677,755 A | 10/1997 | Oshida et al. |
| 5,692,082 A | 11/1997 | Fukushima |
| 5,707,501 A | 1/1998 | Inoue et al. |
| 5,719,704 A | 2/1998 | Shiraishi et al. |
| 5,739,898 A | 4/1998 | Ozawa et al. |
| 5,815,247 A | 9/1998 | Poschenrieder et al. |
| 5,841,500 A | 11/1998 | Patel |
| 5,867,315 A | 2/1999 | Koike et al. |
| 5,933,219 A | 8/1999 | Unno |
| 6,031,658 A | 2/2000 | Riza |
| 6,191,880 B1 | 2/2001 | Schuster |
| 6,211,944 B1 | 4/2001 | Shiraishi |
| 6,229,647 B1 | 5/2001 | Takahashi et al. |
| 6,233,041 B1 | 5/2001 | Shiraishi |
| 6,246,506 B1 | 6/2001 | Kobayashi et al. |
| 6,252,712 B1 | 6/2001 | Fürter et al. |
| 6,258,433 B1 | 7/2001 | Okuda et al. |
| 6,259,512 B1 | 7/2001 | Mizouchi |
| 6,285,443 B1 | 9/2001 | Wangler et al. |
| 6,310,679 B1 | 10/2001 | Shiraishi |
| 6,324,203 B1 | 11/2001 | Owa |
| 6,361,909 B1 | 3/2002 | Gau et al. |
| 6,392,800 B2 | 5/2002 | Schuster |
| 6,404,482 B1 | 6/2002 | Shiraishi |
| 6,452,662 B2 | 9/2002 | Mulkens et al. |
| 6,483,573 B1 | 11/2002 | Schuster |
| 6,535,273 B1 | 3/2003 | Maul |
| 6,538,247 B2 | 3/2003 | Iizuka |
| 6,553,156 B1 | 4/2003 | Li |
| 6,583,931 B2 | 6/2003 | Hiraiwa et al. |
| 6,636,295 B2 | 10/2003 | Shiozawa |
| 6,661,484 B1 | 12/2003 | Iwai et al. |
| 6,661,499 B2 | 12/2003 | Omura et al. |
| 6,721,258 B1 | 4/2004 | Hashimoto |
| 6,769,273 B1 | 8/2004 | Nakagawa et al. |
| 6,774,984 B2 | 8/2004 | Gerhard |
| 6,842,223 B2 | 1/2005 | Tyminski |
| 6,856,379 B2 | 2/2005 | Schuster |
| 6,885,502 B2 | 4/2005 | Schuster |
| 6,913,373 B2 | 7/2005 | Tanaka et al. |
| 6,934,009 B2 | 8/2005 | Terashi |
| 6,943,941 B2 | 9/2005 | Flagello et al. |
| 6,965,484 B2 | 11/2005 | Shaver |
| 6,970,233 B2 | 11/2005 | Blatchford |
| 7,009,686 B2 | 3/2006 | Kawashima et al. |
| 7,038,763 B2 | 5/2006 | Mulder et al. |
| 7,113,260 B2 | 9/2006 | Schuster et al. |
| 7,126,667 B2 | 10/2006 | Kawashima et al. |
| 7,126,673 B2 | 10/2006 | Mori |
| 7,145,720 B2 | 12/2006 | Krahmer et al. |
| 7,170,679 B2 | 1/2007 | Bievenour et al. |
| 7,199,864 B2 | 4/2007 | Gerhard |
| 7,199,936 B2 | 4/2007 | Williams et al. |
| 7,209,289 B2 | 4/2007 | Giordano |
| 7,239,375 B2 | 7/2007 | Tsuji |
| 7,265,816 B2 | 9/2007 | Tsuji |
| 7,292,315 B2 | 11/2007 | Socha et al. |
| 7,304,719 B2 | 12/2007 | Albert et al. |
| 7,345,740 B2 | 3/2008 | Wagner et al. |
| 7,345,741 B2 | 3/2008 | Shiozawa et al. |
| 7,375,887 B2 | 5/2008 | Hansen et al. |
| 7,386,830 B2 | 6/2008 | Fukuhara |
| 7,408,616 B2 | 8/2008 | Gruner et al. |
| 7,408,622 B2 | 8/2008 | Fiolka et al. |
| 7,411,656 B2 | 8/2008 | Totzeck et al. |
| 7,414,786 B2 | 8/2008 | Brown et al. |
| 7,433,046 B2 | 10/2008 | Everett et al. |
| 7,436,491 B2 | 10/2008 | Fukuhara |
| 7,445,883 B2 | 11/2008 | Baba-Ali et al. |
| 7,446,858 B2 | 11/2008 | Kudo et al. |
| 7,499,148 B2 | 3/2009 | Yamada et al. |
| 7,511,884 B2 | 3/2009 | Flagello et al. |
| 7,515,248 B2 | 4/2009 | Tanitsu et al. |
| 2001/0012154 A1 | 8/2001 | Schuster |
| 2001/0019404 A1 | 9/2001 | Schuster et al. |
| 2002/0024008 A1 | 2/2002 | Iizuka |
| 2002/0085176 A1 | 7/2002 | Hiraiwa et al. |
| 2002/0085276 A1 | 7/2002 | Tanitsu et al. |
| 2002/0126380 A1 | 9/2002 | Schuster |
| 2002/0149847 A1 | 10/2002 | Osawa et al. |
| 2002/0152452 A1 | 10/2002 | Socha |
| 2002/0163629 A1 | 11/2002 | Switkes et al. |
| 2002/0176166 A1* | 11/2002 | Schuster ........................ 359/494 |
| 2002/0177048 A1 | 11/2002 | Saitoh et al. |
| 2002/0177054 A1 | 11/2002 | Saitoh et al. |
| 2002/0186462 A1 | 12/2002 | Gerhard |
| 2002/0191288 A1 | 12/2002 | Gruner et al. |
| 2002/0196416 A1 | 12/2002 | Shiraishi |
| 2002/0196629 A1 | 12/2002 | Terashi |
| 2003/0007158 A1* | 1/2003 | Hill ............................... 356/493 |
| 2003/0038225 A1 | 2/2003 | Mulder et al. |
| 2003/0053036 A1 | 3/2003 | Fujishima et al. |
| 2003/0086070 A1* | 5/2003 | Goo et al. ........................ 355/71 |
| 2003/0095241 A1 | 5/2003 | Burghoorn |
| 2003/0160949 A1 | 8/2003 | Komatsuda et al. |
| 2004/0012764 A1 | 1/2004 | Mulder et al. |
| 2004/0169924 A1* | 9/2004 | Flagello et al. ............... 359/486 |
| 2004/0184019 A1 | 9/2004 | Totzeck et al. |
| 2004/0240073 A1 | 12/2004 | Gerhard |
| 2005/0164522 A1 | 7/2005 | Kunz et al. |
| 2005/0195480 A1 | 9/2005 | Brown et al. |
| 2005/0219696 A1 | 10/2005 | Albert et al. |
| 2005/0237527 A1 | 10/2005 | Mori |
| 2005/0264885 A1 | 12/2005 | Albert |
| 2005/0286038 A1 | 12/2005 | Albert et al. |
| 2006/0055834 A1 | 3/2006 | Tanitsu et al. |
| 2006/0072095 A1 | 4/2006 | Kudo et al. |
| 2006/0077370 A1 | 4/2006 | Mulkens et al. |
| 2006/0092398 A1 | 5/2006 | McCarthy |
| 2006/0119826 A1 | 6/2006 | Gerhard |
| 2006/0139611 A1 | 6/2006 | Wagner et al. |
| 2006/0146384 A1 | 7/2006 | Schultz et al. |
| 2006/0158624 A1 | 7/2006 | Toyoda |
| 2006/0170901 A1 | 8/2006 | Tanitsu et al. |
| 2006/0203214 A1 | 9/2006 | Shiraishi |
| 2006/0221453 A1 | 10/2006 | Koehler et al. |
| 2006/0291057 A1 | 12/2006 | Fiolka et al. |
| 2007/0008511 A1 | 1/2007 | DeBoeij et al. |
| 2007/0019179 A1 | 1/2007 | Fiolka et al. |
| 2007/0058151 A1 | 3/2007 | Eurlings et al. |
| 2007/0081114 A1 | 4/2007 | Fiolka et al. |
| 2007/0139636 A1 | 6/2007 | Gerhard |
| 2007/0146676 A1 | 6/2007 | Tanitsu et al. |
| 2007/0222962 A1 | 9/2007 | Kudo |
| 2007/0296941 A1 | 12/2007 | Omura |

| | | | | | | |
|---|---|---|---|---|---|---|
| 2008/0024747 A1 | 1/2008 | Kudo et al. | | JP | 32-46615 | 11/2001 |
| 2008/0068572 A1 | 3/2008 | Kudo et al. | | JP | 3246615 B2 | 1/2002 |
| 2008/0130109 A1 | 6/2008 | Albert et al. | | JP | 2002-075816 | 3/2002 |
| 2008/0316598 A1 | 12/2008 | Fiolka et al. | | JP | 2002-75835 | 3/2002 |
| 2009/0002675 A1 | 1/2009 | Fiolka et al. | | JP | 2002-231619 | 8/2002 |
| 2009/0073414 A1 | 3/2009 | Tanitsu et al. | | JP | 2002-324743 | 11/2002 |
| 2009/0073441 A1 | 3/2009 | Tanitsu et al. | | JP | 2002 334836 | 11/2002 |
| 2009/0115989 A1 | 5/2009 | Tanaka | | JP | 2003-35822 | 2/2003 |
| 2009/0122292 A1 | 5/2009 | Shiraishi | | JP | 2003-059821 | 2/2003 |
| 2009/0128796 A1 | 5/2009 | Tanaka | | JP | 2003 297727 | 10/2003 |
| 2009/0147233 A1 | 6/2009 | Toyoda | | JP | 2004-179172 | 6/2004 |
| 2009/0147234 A1 | 6/2009 | Toyoda | | JP | 2005-108925 | 4/2005 |
| 2009/0147235 A1 | 6/2009 | Toyoda | | JP | 2005 166871 | 6/2005 |
| 2009/0185156 A1 | 7/2009 | Kudo et al. | | KR | 2000-0076783 | 12/2000 |
| 2009/0275420 A1 | 11/2009 | Tanaka | | WO | WO 99/49504 | 9/1999 |
| 2009/0284729 A1 | 11/2009 | Shiraishi | | WO | WO 00/02092 | 1/2000 |
| 2009/0296066 A1 | 12/2009 | Fiolka | | WO | WO 00/67303 | 11/2000 |
| 2009/0316132 A1 | 12/2009 | Tanitsu et al. | | WO | WO 00/79331 | 12/2000 |
| 2009/0323041 A1 | 12/2009 | Toyoda | | WO | WO 01/51981 A1 | 7/2001 |
| 2010/0045957 A1 | 2/2010 | Fiolka et al. | | WO | WO 02/082169 | 10/2002 |
| 2010/0141921 A1 | 6/2010 | Omura | | WO | WO 02/093209 | 11/2002 |
| 2010/0141926 A1 | 6/2010 | Omura | | WO | WO 03/067334 A2 | 8/2003 |
| 2010/0142051 A1 | 6/2010 | Omura | | WO | WO 03/076978 A2 | 9/2003 |
| 2010/0177293 A1 | 7/2010 | Fiolka et al. | | WO | WO 2004/051717 | 6/2004 |
| | | | | WO | WO 2004/102273 | 11/2004 |

FOREIGN PATENT DOCUMENTS

| | | |
|---|---|---|
| DE | 195 20 563 | 12/1996 |
| DE | 195 29 563 | 2/1997 |
| DE | 196 21512 | 12/1997 |
| DE | 19621512 A1 | 12/1997 |
| DE | 198 07 120 | 8/1999 |
| EP | 0 230 931 A2 | 8/1987 |
| EP | 0 764 858 | 8/1996 |
| EP | 0 744 664 | 11/1996 |
| EP | 08 23662 | 2/1998 |
| EP | 1 014 196 A2 | 6/2000 |
| EP | 1 045 272 A2 | 10/2000 |
| EP | 1 069 600 | 1/2001 |
| EP | 1 367 446 A1 | 12/2003 |
| EP | 1260849 B1 | 12/2004 |
| EP | 1 720 199 | 11/2006 |
| GB | 856621 | 12/1960 |
| JP | 61-091662 | 5/1986 |
| JP | 62-265722 | 11/1987 |
| JP | 63044726 A | 2/1988 |
| JP | 04-101148 | 4/1992 |
| JP | 04-225357 | 8/1992 |
| JP | 05-109601 | 4/1993 |
| JP | 5090128 A | 4/1993 |
| JP | 05-283317 | 10/1993 |
| JP | 05-326370 | 12/1993 |
| JP | 06-53120 | 2/1994 |
| JP | 6-53120 | 2/1994 |
| JP | 6118623 A | 4/1994 |
| JP | 06-124873 | 5/1994 |
| JP | 6140306 A | 5/1994 |
| JP | 06-196388 | 7/1994 |
| JP | 06-204121 | 7/1994 |
| JP | H06-188169 | 7/1994 |
| JP | 7-142338 | 6/1995 |
| JP | 7 183201 | 7/1995 |
| JP | 07 183201 | 7/1995 |
| JP | 7201723 A | 8/1995 |
| JP | 07-283119 | 10/1995 |
| JP | 07-307268 | 11/1995 |
| JP | 7307268 A | 11/1995 |
| JP | 9043401 A | 2/1997 |
| JP | 9 120154 | 5/1997 |
| JP | 09 120154 | 5/1997 |
| JP | 09-184918 | 7/1997 |
| JP | 09-219358 | 8/1997 |
| JP | 10079337 A | 3/1998 |
| JP | 10-104427 | 4/1998 |
| JP | 10-303114 | 11/1998 |
| JP | 11-54426 | 2/1999 |
| JP | 2000-114157 | 4/2000 |
| JP | 2001-135560 | 5/2001 |
| JP | 2001-274083 | 10/2001 |
| JP | 2001284228 A | 10/2001 |

| | | |
|---|---|---|
| WO | WO2004102273 A2 | 11/2004 |
| WO | WO2005026822 A2 | 3/2005 |
| WO | WO2005027207 A1 | 3/2005 |
| WO | WO 2005/031467 | 4/2005 |
| WO | WO 2005/036619 | 4/2005 |
| WO | WO 2005/041277 | 5/2005 |
| WO | WO 2005/059645 | 6/2005 |
| WO | WO 2005/059653 A2 | 6/2005 |
| WO | WO2005050718 A1 | 6/2005 |
| WO | WO 2005/069081 | 7/2005 |
| WO | WO 2005/076045 | 8/2005 |
| WO | WO 2005/116772 | 12/2005 |
| WO | WO 2006/021288 A1 | 3/2006 |
| WO | WO 2006/059549 | 6/2006 |
| WO | WO 2006/077849 | 7/2006 |
| WO | WO2007039519 A1 | 4/2007 |

OTHER PUBLICATIONS

Shafer et al. v. Omura, "Shafer Motions List," for Patent Interference No. 105,678 (SCM), filed Mar. 25, 2009 with the United States Patent and Trademark Office before the Board of Patent Appeals and Interferences (13 pages).

Shafer et al. v. Omura, "Judgment—Request for Adverse—Bd.R. 127(b)," for Patent Interference No. 105,678 (SCM), filed Aug. 31, 2009 with the United States Patent and Trademark Office before the Board of Patent Appeals and Interferences (3 pages).

Hecht, Optics, Pearson Education Inc. Fourth Edition, 348-349 and 360, 2002.

Bruner et al., "High NA Lithographic Imaging at Brewster's Angle," SPIE (USA), vol. 4691, pp. 1-24, 2002.

Fused quartz, http://en.wikipedia.org/wiki/Fused_quartz, Aug. 27, 2009.

International Preliminary Report on Patentability for the corresponding PCT application PCT/EP2005/000320, filed Jan. 14, 2005.

EP office action, dated Mar. 3, 2008, for the corresponding EP Application No. 05 706 888.4.

Chinese Office Action with English translation, dated May 9, 2008, for the corresponding Chinese Application No. 200580002241.9, filed Jan. 14, 2005.

Chinese Office Action with English translation, dated Dec. 5, 2008, for the corresponding Chinese Application No. 200580002241.9, filed Jan. 14, 2005.

Chinese Office Action with English translation, dated Apr. 10, 2009, for the corresponding Chinese Application No. 200580002241.9, filed Jan. 14, 2005.

International Search Report for International Application No. PCT/EP05/050981, dated Jul. 28, 2005.

International Preliminary Report on Patentability for International Application No. PCT/EP05/050981, dated Nov. 29, 2006.

Japanese Office Action with English translation for Application No. 2006-548272, issued Sep. 27, 2010.

Hecht, Optics, Pearson Education Inc. Fourth Edition, 342-343, 2002.

Himel et al., "Design and fabrication of customized illumination patterns for low ki lithography: a diffractive approach," Optical Microlithography XIV, Christopher J. Progler, Editor, Proceedings of SPIE vol. 4346 (2001).

EP office action for the corresponding EP Application No. 05 706 888.4 dated Aug. 19, 2010.

Chinese Office Action, with English translation, for the corresponding Chinese Application No. 2010-10155323.X, dated Jan. 20, 2011.

Chinese Office Action, with English translation, for the corresponding Chinese Application No. 2010-10155325.9, dated Jan. 25, 2011.

Chinese Office Action with English translation, for the corresponding Chinese Application No. 2010-10155335.2, dated Mar. 17, 2011.

Hecht, Optics, Pearson Education Inc. Fourth Edition, 352-355, 2002.

Smith et al., "Benefiting from polarization—effects on high-NA imaging," Optical Microlithography XVII, Proc. of SPIE vol. 5377, Bellingham, WA, 2004, pp. 68-79.

Korean Office Action, with English translation, for corresponding KR Appl No. 10-2006-7010502, dated Jul. 20, 2011.

Japanese Office Action, with English translation, for JP Application No. 2006-548272, issued Jul. 4, 2011.

Chinese Office Action with English translation, for the corresponding Chinese Application No. 200910253785.2, dated Jul. 20, 2011.

Chinese Office Action with English translation, for the corresponding Chinese Application No. 201010155325.9, dated Oct. 17, 2011.

Hecht, Optics, Pearson Education Inc., Fourth Edition, 366-367, 2002.

Fused quartz, http://en.wikipedia.org/wiki/Fused_quartz.

Chinese Office Action with English translation, for the corresponding Chinese Application No. 201010155323.X, dated Dec. 31, 2011.

Applied Optics II, Baifukan Co., Ltd., pp. 166-167, Jul. 1990.

\* cited by examiner a)

b)

c)

POLARIZATION-MODULATING OPTICAL ELEMENT

CROSS-REFERENCE TO RELATED APPLICATIONS

This application is a continuation application of U.S. application Ser. No. 11/440,475, filed May 25, 2006, which is a Continuation-In-Part of, and claims priority under 35 U.S.C. §120 to, International Application PCT/EP2005/000320, having an international filing date of Jan. 14, 2005, which claimed the benefit of U.S. Ser. No. 60/537,327, filed on Jan. 16, 2004. This application also claims the benefit under 35 U.S.C. §119 of U.S. Ser. No. 60/684,607, filed on May 25, 2005. Each of these applications is incorporated herein by reference.

FIELD OF THE INVENTION

The invention relates to an optical element that affects the polarization of light rays. The optical element has a thickness profile and consists of or comprises an optically active crystal with an optical axis.

BACKGROUND

In the continuing effort to achieve structures of finer resolution in the field of microlithography, there is a parallel pursuit of substantially three guiding concepts. The first of these is to provide projection objectives of very high numerical aperture. Second is the constant trend towards shorter wavelengths, for example 248 nm, 193 nm, or 157 nm. Finally, there is the concept of increasing the achievable resolution by introducing an immersion medium of a high refractive index into the space between the last optical element of the projection objective and the light-sensitive substrate. The latter technique is referred to as immersion lithography.

In an optical system that is illuminated with light of a defined polarization, the s- and p-component of the electrical field vector, in accordance with Fresnel's equations, are subject to respectively different degrees of reflection and refraction at the interface of two media with different refractive indices. In this context and hereinafter, the polarization component that oscillates parallel to the plane of incidence of a light ray is referred to as p-component, while the polarization component that oscillates perpendicular to the plane of incidence of a light ray is referred to as s-component. The different degrees of reflection and refraction that occur in the s-component in comparison to the p-component have a significant detrimental effect on the imaging process.

This problem can be avoided with a special distribution of the polarization where the planes of oscillation of the electrical field vectors of individual linearly polarized light rays in a pupil plane of the optical system have an approximately radial orientation relative to the optical axis. A polarization distribution of this kind will hereinafter be referred to as radial polarization. If a bundle of light rays that are radially polarized in accordance with the foregoing definition meets an interface between two media of different refractive indices in a field plane of an objective, only the p-component of the electrical field vector will be present, so that the aforementioned detrimental effect on the imaging quality is reduced considerably.

In analogy to the foregoing concept, one could also choose a polarization distribution where the planes of oscillation of the electrical field vectors of individual linearly polarized light rays in a pupil plane of the system have an orientation that is perpendicular to the radius originating from the optical axis. A polarization distribution of this type will hereinafter be referred to as tangential polarization. If a bundle of light rays that are tangentially polarized in accordance with this definition meets an interface between two media of different refractive indices, only the s-component of the electrical field vector will be present so that, as in the preceding case, there will be uniformity in the reflection and refraction occurring in a field plane.

Providing an illumination with either tangential or radial polarization in a pupil plane is of high importance in particular when putting the aforementioned concept of immersion lithography into practice, because of the considerable negative effects on the state of polarization that are to be expected based on the differences in the refractive index and the strongly oblique angles of incidence at the respective interfaces from the last optical element of the projection objective to the immersion medium and from the immersion medium to the coated light-sensitive substrate.

SUMMARY

In one aspect, the invention generally features a microlithography optical system that includes an illumination system, a projection objective and a temperature compensated polarization-modulating optical element in the illumination system. The temperature compensated polarization-modulating optical element includes a first polarization-modulating optical element that includes an optically active material. The first polarization-modulating optical element has a first specific rotation with a sign. The temperature compensated polarization-modulating optical element also includes a second polarization-modulating optical element comprising optically active material. The second polarization-modulating optical element has a second specific rotation with a sign opposite to the sign of the first specific rotation.

In another aspect, the invention generally features using the system described in the preceding paragraph to manufacturing a micro-structured semiconductor component.

In a further aspect, the invention generally features an optical element that includes a temperature compensated polarization-modulating element. The temperature compensated polarization-modulating element includes a first polarization-modulating optical element having a first thickness. The first polarization-modulating element includes an optically active material with a first specific rotation having a sign. The temperature compensated polarization-modulating element also includes a second polarization-modulating optical element having a second thickness different from said first thickness. The second polarization-modulating optical element includes an optically active material with a second specific rotation having a sign opposite the sign of the first specific rotation.

In an additional aspect, the invention generally a microlithography optical system that includes an illumination system, a projection objective and the optical element described in the preceding paragraph. The optical element is in the illumination system.

In another aspect, the invention generally features using the system described in the preceding paragraph to manufacturing a micro-structured semiconductor component.

In a further aspect, the invention generally features an optical system that has an optical axis. The optical system includes a first plane plate and a second plane plate. The first plane plate includes optically active quartz, and the first plane plate has a first thickness in the direction of the optical axis.

The second plane plate includes optically active quartz. The second plane plate has a second thickness in the direction of the optical axis, and the second thickness being different from the first thickness.

In an additional aspect, the invention generally features a system that includes an illumination system, a projection objective and an optical system having an optical axis. The optical system includes a first plane plate and a second plane plate. The first plate includes optically active quartz. The first plane plate has a first thickness in the direction of the optical axis. The second plane plate includes optically active quartz. The second plane plate has a second thickness in the direction of the optical axis, and the second thickness being different from the first thickness.

In one aspect, the invention generally features an optical element that includes a support plate comprising optically active material, and at least two planar-parallel portions. Each of the at least two planar-parallel portions includes optically active material. When a first linearly polarized light ray passes through the optical element, a plane of oscillation of the first linearly polarized light ray is rotated by a first angle. When a second linearly polarized light ray passes through the optical element, a plane of oscillation of the second linearly polarized light ray is rotated by a second angle different from the first angle.

In another aspect, the invention generally features a microlithography optical system that includes an illumination system, a projection objective and the optical element described in the preceding paragraph. The optical element is in the illumination system.

In a further aspect, the invention generally features using the system described in the preceding paragraph to manufacturing a micro-structured semiconductor component.

In an additional aspect, the invention generally features an optical arrangement that includes a polarization-modulating optical element that includes a first optically active material having a first specific rotation with a sign. The polarization-modulating optical element has a first optical axis, and the polarization-modulating element has a first thickness profile that, as measured in the direction of the first optical axis, is variable. The optical arrangement also includes a compensation plate that includes a second optically active material having a second specific rotation with a sign opposite the sign of the first specific rotation. The compensation plate has a second thickness profile configured so that, when radiation passes through the optical arrangement, the compensation plate substantially compensates for angle deviations of the radiation that are caused by the polarization-modulating optical element.

In another aspect, the invention generally features a microlithography optical system that includes an illumination system, a projection objective and the optical arrangement described in the preceding paragraph. The optical arrangement is in the illumination system.

In a further aspect, the invention generally features using the system described in the preceding paragraph to manufacturing a micro-structured semiconductor component.

In certain embodiments, a polarization-modulating optical element is provided, which—with a minimum loss of intensity—affects the polarization of light rays in such a way that from linearly polarized light with a first distribution of the directions of the oscillation planes of individual light rays, the optical element generates linearly polarized light with a second distribution of the directions of the oscillation planes of individual light rays.

In some embodiments, an optical system is provided that has improved properties of the polarization-modulating optical element regarding thermal stability of the second distribution of oscillation planes (polarization distribution), and/or minimized influence of additional optical elements in the optical system to the polarization distribution after the light rays have passed these elements.

In some embodiments, a polarization-modulating optical element is provided which consists of or comprises an optically active crystal and which is shaped with a thickness profile that varies in the directions perpendicular to the optical axis.

A polarization-modulating optical element can have the effect that the plane of oscillation of a first linearly polarized light ray and the plane of oscillation of a second linearly polarized light ray are rotated, respectively, by a first and a second angle of rotation, with the first angle of rotation being different from the second angle of rotation. The polarization-modulating optical element can be made of an optically active material.

In some embodiments, one or more of the following desirable features can be provided.

In order to generate from linearly polarized light an arbitrarily selected distribution of linearly polarized light rays with a minimum loss of intensity, an optically active crystal with an optical axis is used as raw material for the polarization-modulating optical element. The optical axis of a crystal, also referred to as axis of isotropy, is defined by the property that there is only one velocity of light propagation associated with the direction of the optical axis. In other words, a light ray travelling in the direction of an optical axis is not subject to a linear birefringence. The polarization-modulating optical element has a thickness profile that varies in the directions perpendicular to the optical axis of the crystal. The term "linear polarization distribution" in this context and hereinafter is used with the meaning of a polarization distribution in which the individual light rays are linearly polarized but the oscillation planes of the individual electrical field vectors can be oriented in different directions.

If linearly polarized light traverses the polarization-modulating optical element along the optical axis of the crystal, the oscillation plane of the electrical field vector is rotated by an angle that is proportional to the distance traveled inside the crystal. The sense of rotation, i.e., whether the oscillation plane is rotated clockwise or counterclockwise, depends on the crystal material, for example right-handed quartz vs. left-handed quartz. The polarization plane is parallel to the respective directions of the polarization and the propagation of the light ray. In order to produce an arbitrarily selected distribution of the angles of rotation, it is advantageous if the thickness profile is designed so that the plane of oscillation of a first linearly polarized light ray and the plane of oscillation of a second linearly polarized light ray are rotated, respectively, by a first and a second angle of rotation, with the first angle of rotation being different from the second angle of rotation. By shaping the element with a specific thickness at each location, it is possible to realize arbitrarily selected angles of rotation for the oscillation planes.

Different optically active materials have been found suitable dependent on the wavelength of the radiation being used, specifically quartz, $TeO_2$, and $AgGaS_2$.

In an advantageous embodiment, the polarization-modulating optical element has an element axis oriented in the same direction as the optical axis of the crystal. In relation to the element axis, the thickness profile of the optical element is a function of the azimuth angle $\theta$ alone, with the azimuth angle $\theta$ being measured relative to a reference axis that intersects the element axis at a right angle. With a thickness profile according to this design, the thickness of the optical element is constant along a radius that intersects the element axis at a right angle and forms an azimuth angle θ with the reference axis.

In a further advantageous embodiment, an azimuthal section d(r=const.,θ) of the thickness profile d(r,θ) at a constant distance r from the element axis is a linear function of the azimuth angle θ. In the ideal case, this azimuthal section has a discontinuity at the azimuth angle θ=0. The linear function d(r=const.,θ) at a constant distance r from the element axis has a slope $$|m| = \frac{180°}{\alpha \Pi r},$$

wherein α stands for the specific rotation of the optically active crystal. At the discontinuity location for θ=0, there is an abrupt step in the thickness by an amount of 360°/α. The step at the discontinuity location can also be distributed over an azimuth angle range of a few degrees. However, this has the result of a non-optimized polarization distribution in the transition range.

In a further advantageous embodiment, an azimuthal section d(r=const.,θ) of the thickness profile d(r,θ) at a constant distance r from the element axis is a linear function of the azimuth angle θ with the same slope m but, in the ideal case, with two discontinuities at the azimuth angles θ=0 and θ=180°, respectively. At each discontinuity location, there is an abrupt step in the thickness by an amount of 180°/α. The two abrupt steps at the discontinuity locations can also be distributed over an azimuth angle range of a few degrees. However, this has the result of a non-optimized polarization distribution in the transition range.

In a further advantageous embodiment, an azimuthal section d(r=const.,θ) of the thickness profile d(r,θ) at a constant distance r from the element axis and in a first azimuth angle range of 10°<θ<170° is a linear function of the azimuth angle θ with a first slope m, while in a second azimuth angle range of 190°<θ<350°, the azimuthal section is a linear function of the azimuth angle θ with a second slope n. The slopes m and n have the same absolute magnitude but opposite signs. The magnitude of the slopes m and n at a distance r from the element axis is $$|m| = |n| = \frac{180°}{\alpha \Pi r}.$$

With this arrangement, the thickness profile for all azimuth angles, including θ=0 and θ=180°, is a continuous function without abrupt changes in thickness.

In a further advantageous embodiment, the polarization-modulating optical element is divided into a large number of planar-parallel portions of different thickness or comprises at least two planar-parallel portions. These portions can for example be configured as sectors of a circle, but they could also have a hexagonal, square, rectangular, or trapezoidal shape.

In a further advantageous embodiment, a pair of first plan-parallel portions are arranged on opposite sides of a central element axis of said polarization-modulating optical element, and a pair of second plan-parallel portions are arranged on opposite sides of said element axis and circumferentially displaced around said element axis with respect to said first plan-parallel portions, wherein each of said first portions has a thickness being different from a thickness of each of said second portions.

In a further advantageous embodiment, a plane of oscillation of linearly polarized light passing through the polarization-modulating optical element is rotated by a first angle of rotation $\beta_1$ within at least one of said first plan-parallel portions and by a second angle of rotation $\beta_2$ within at least one of said second plan-parallel portions, such that $\beta_1$ and $\beta_2$ are approximately conforming or conform to the expression $|\beta_2-\beta_1|=(2n+1)\cdot 90°$, with n representing an integer.

In an advantageous embodiment, $\beta_1$ and $\beta_2$ are approximately conforming or conform to the expressions $\beta_1=90°+p\cdot 180°$, with p representing an integer, and $\beta_2=q\cdot 180°$, with q representing an integer other than zero. As will discussed below in more detail, such an embodiment of the polarization modulating optical element may be advantageously used in affecting the polarization of traversing polarized light such that exiting light has a polarization distribution being—depending of the incoming light—either approximately tangentially or approximately radially polarized.

The pair of second plan-parallel portions may particularly be circumferentially displaced around said element axis with respect to said pair of first plan-parallel portions by approximately 90°.

In a further advantageous embodiment, said pair of first plan-parallel portions and said pair of second plan-parallel portions are arranged on opposite sides of a central opening or a central obscuration of said polarization-modulating optical element.

Adjacent portions of said first and second pairs can be spaced apart from each other by regions being opaque to linearly polarized light entering said polarization-modulating optical element. Said portions of said first and second group can particularly be held together by a mounting. Said mounting can be opaque to linearly polarized light entering said polarization-modulating optical element. The mounting can have a substantially spoke-wheel shape.

In a further advantageous embodiment, the polarization-modulating optical element comprises a first group of substantially planar-parallel portions wherein a plane of oscillation of traversing linearly polarized light is rotated by a first angle of rotation $\beta_1$, and a second group of substantially planar-parallel portions wherein a plane of oscillation of traversing linearly polarized light is rotated by a second angle of rotation, such that $\beta_1$ and $\beta_2$ are approximately conforming or conform to the expression $|\beta_2-\beta_1|=(2n+1)\cdot 90°$, with n representing an integer.

In a further advantageous embodiment, $\beta_1$ and $\beta_2$ are approximately conforming to the expressions $\beta_1=90°+p\cdot 180°$, with p representing an integer, and $\beta_2=q\cdot 180°$, with q representing an integer other than zero.

In a further advantageous embodiment, the thickness profile of the polarization-modulating optical element has a continuous surface contour without abrupt changes in thickness, whereby an arbitrarily selected polarization distribution can be generated whose thickness profile is represented by a continuous function of the location.

To ensure an adequate mechanical stability of the optical element, it is preferred to make the minimal thickness $d_{min}$ of the polarization-modulating optical element at least equal to 0.002 times the element diameter D.

If the optically active material used for the optical element also has birefringent properties as is the case for example with crystalline quartz, the birefringence has to be taken into account for light rays whose direction of propagation deviates from the direction of the optical crystal axis. A travel distance of 90°/α inside the crystal causes a linear polarization to be rotated by 90°. If birefringence is present in addition to the rotating effect, the 90° rotation will be equivalent to an exchange between the fast and slow axis in relation to the electrical field vector of the light. Thus, a total compensation of the birefringence is provided for light rays with small angles of incidence if the distance traveled inside the crystal equals an integer multiple of 180°/α. In order to meet the aforementioned requirement for mechanical stability while simultaneously minimizing the effects of birefringence, it is of advantage if the polarization-modulating optical element is designed with a minimum thickness of $$d_{min} = N \cdot \frac{90°}{\alpha},$$

where N represents a positive integer.

From a manufacturing point of view, it is advantageous to provide the optical element with a hole at the center or with a central obscuration.

For light rays propagating not exactly parallel to the optical crystal axis, there will be deviations of the angle of rotation. In addition, the birefringence phenomenon will have an effect. It is therefore particularly advantageous if the maximum angle of incidence of an incident light bundle with a large number of light rays within a spread of angles relative to the optical crystal axis is no larger than 100 mrad, preferably no larger than 70 mrad, and with special preference no larger than 45 mrad.

In order to provide an even more flexible control over a state of polarization, an optical arrangement is advantageously equipped with a device that allows at least one further polarization-modulating optical element to be placed in the light path. This further polarization-modulating optical element can be an additional element with the features described above. However, it could also be configured as a planar-parallel plate of an optically active material or an arrangement of two half-wavelength plates whose respective fast and slow axes of birefringence are rotated by 45° relative to each other.

The further polarization-modulating optical element that can be placed in the optical arrangement can in particular be designed in such a way that it rotates the oscillation plane of a linearly polarized light ray by 90°. This is particularly advantageous if the first polarization-modulating element in the optical arrangement produces a tangential polarization. By inserting the 90°-rotator, the tangential polarization can be converted to a radial polarization.

In a further embodiment of the optical arrangement, it can be advantageous to configure the further polarization-modulating optical element as a planar-parallel plate which works as a half-wavelength plate for a half-space that corresponds to an azimuth-angle range of 180°. This configuration is of particular interest if the first polarization-modulating optical element has a thickness profile (r=const.,θ) that varies only with the azimuth angle θ and if, in a first azimuth angle range of 10°<θ<170°, the thickness profile (r=const.,θ) is a linear function of the azimuth angle θ with a first slope m, while in a second azimuth angle range of 190°<θ<350°, the thickness profile is a linear function of the azimuth angle θ with a second slope n, with the slopes m and n having the same absolute magnitude but opposite signs.

The refraction occurring in particular at sloped surfaces of a polarization-modulating element can cause a deviation in the direction of an originally axis-parallel light ray after it has passed through the polarization-modulating element. In order to compensate this type of deviation of the wave front which is caused by the polarization-modulating element, it is advantageous to arrange a compensation plate in the light path of an optical system, with a thickness profile of the compensation plate designed so that it substantially compensates an angular deviation of the transmitted radiation that is caused by the polarization-modulating optical element. Alternatively, an immersion fluid covering the profiled surface of the polarization-modulating element could be used for the same purpose.

Principally, in order to achieve the effect of compensating for the deviation in the direction of an originally axis-parallel light ray due to the polarization-modulating element, it would be possible to use a non-birefringent material such as $CaF_2$ or fused silica as raw material for the compensation plate. However, significant drawbacks of such an optical arrangement are as follows: $CaF_2$ is relatively difficult to handle during the manufacturing of the compensation plate, which usually makes it necessary to enhance its thickness e.g. up to 5 mm to achieve sufficient mechanical stability, leading to an enhancement of the space needed in the optical design. Fused silica is relatively sensitive to thermal compaction leading to local variations of the density and non-deterministic birefringence properties, which inadvertently modifies or destroys the polarization distribution after the optical arrangement. Furthermore, since the refraction indices of $CaF_2$ or fused silica, on the one hand, and the optically active material of the polarization-modulating element, on the other hand, are not the same, the slopes in the thickness profiles of the compensation plate and the polarization-modulating element (or the "wedge angles") in these elements, have to be different. With other words, the distance between the curved surfaces of these elements is not constant, which leads to a non-symmetric ray displacement for a light ray passing through the arrangement.

In order to avoid the above drawbacks while achieving a compensation for the deviation in the direction of an originally axis-parallel light due to the polarization-modulating element, an optical arrangement according to a further aspect of the present invention comprises a polarization-modulating optical element having a first thickness profile and comprising a first optically active material with a first optical axis, wherein said first thickness profile, as measured in the direction of said optical axis, is variable, and a compensation plate being arranged in the light path of the optical system and having a second thickness profile configured to substantially compensate for angle deviations of transmitted radiation which are caused by said polarization-modulating optical element, wherein said compensation plate comprises a second optically active material with a specific rotation of opposite sign compared to said first optically active material.

Like in the embodiments of the polarization-modulating element discussed above, the first and second optically active materials could be solid or liquid optically active materials.

In an advantageous embodiment, the polarization-modulating optical element and the compensation plate are made of optical isomers. In a particular advantageous embodiment, the polarization-modulating optical element and the compensation plate are made of optically active crystalline quartz with clockwise and counterclockwise specific rotation. With other words, if the polarization-modulating optical element is made of R-quartz, the compensation plate is preferably made of L-quartz and vice versa. In such a combination of optically active materials with a specific rotation of opposite sign, a net change in the polarization direction of any linear polarized light ray will still occur, but is now depending on the value of the difference in the respective thicknesses being passed in these optically active materials. Such an embodiment has, in particular, the following advantageous effects:

a) Since the refractive indices in the R-quartz and the L-quartz are substantially the same, the slopes in the thickness profiles of the compensation plate and the polarization-modulating element (or the "wedge angles" in these elements) may also be the same. In particular, both elements may be in direct contact to each other with their respective inclined or curved surface, in order to effectively forming a common or single optical element having the shape of a substantially plan-parallel plate. Alternatively, the compensation plate and the polarization-modulating element may also be arranged spaced apart from each other such that the distance between the inclined or curved surfaces of these elements is constant. As a consequence, any ray displacement that occurs for a light ray passing through the arrangement of the compensation plate and the polarization-modulating element will be symmetric.

b) Any parts of the polarization-modulating element and the corresponding counter-part of the compensation plate can be substantially identical in geometry, making it possible to identically perform the corresponding manufacturing process (i.e. with the same programming of the tools used for the manufacturing procedure).

c) Since the polarization-modulating optical element and the compensation plate are turning the direction of polarization of linear polarized light into opposite directions, temperature-induced modifications of the effective rotation of polarization in these elements will be at least partially compensated. In particular, any offset thickness of the compensation plate or the polarization-modulating element, respectively, will be without influence with regard to temperature changes, since the accompanying temperature-induced modifications of the effective rotation in one of the elements will be compensated by the opposed effective rotation in the other element.

d) Since both the polarization-modulating optical element and the compensation plate are providing optical activity with a variable thickness profile, the respective slopes in the thickness profiles of the compensation plate and the polarization-modulating element may be reduced for each of these elements, if compared to the case where only the polarization-modulating optical element is made of optically active material. In particular, in the specific case where both the compensation plate and the polarization-modulating element have a substantially wedge-shaped cross-section, a tangential polarization distribution can be achieved with substantially half of the slope of the inclined surface of the compensation plate or the polarization-modulating element, respectively, if compared to the case where only the polarization-modulating optical element is made of optically active material. As a consequence of these reduced slopes, the space needed in the optical design is reduced and the manufacturing process is simplified due to less effort in the abrasive treatment of the respective raw materials used for making the compensation plate and the polarization-modulating element.

Polarization-modulating elements of the foregoing description, and optical arrangements equipped with them, are advantageously used in projection systems for microlithography applications. In particular, polarization-modulating elements of this kind and optical arrangements equipped with them are well suited for projection systems in which the aforementioned immersion technique is used, i.e., where an immersion medium with a refractive index different from air is present in the space between the optical element nearest to the substrate and the substrate.

According to a further aspect of the present invention, a polarization-modulating optical element is provided, wherein a plane of oscillation of a first linearly polarized light ray and a plane of oscillation of a second linearly polarized light ray are rotated, respectively, by a first angle of rotation and a second angle of rotation in such a way that said first angle of rotation is different from said second angle of rotation;

wherein said polarization-modulating optical element comprises at least two planar-parallel portions that consist of an optically active material; and wherein said planar-parallel portions are arranged on a support plate that consists of an optically active material.

As a consequence of making the support plate—like the at least two planar-parallel portions which are arranged thereon—of an optically active material, an enhanced durability of a wringing-connection between the support plate and said planar-parallel portions can be achieved, in particular under varying temperature conditions. The enhanced stability or durability of the wringing-connection particularly results from the fact that the support plate may be made from the same material and even with the same crystal orientation. Physical properties as the refraction numbers or expansion coefficients of the optically quartz material in the support plate and the plan-parallel portions can be made rotational symmetric with regard to the respective optical crystal axis. In particular, it can be achieved that the thermal expansion coefficients of the support plate and the plan-parallel portions (e.g. sector-shaped parts) are identical. Therefore, if the temperature changes in the direct environment of the contact region between the support plate and the planar-parallel portions (e.g. due to laser irradiation during the microlithography process or during applying antireflection coatings), the temperature increase and the thermal expansion are the same in the support plate and the planar-parallel portions, so that the risk of a temperature- or stress-induced loose of contact between these element is significantly reduced or eliminated, if e.g. compared to the use of a support plate made of $CaF_2$ or fused silica ($SiO_2$). A further advantage is that the use of an optical active material such as crystalline quartz avoids compaction effects as occurring e.g. in fused silica.

According to a further aspect the present invention relates to a projection system, comprising a radiation source, an illumination system operable to illuminate a structured mask, and a projection objective for projecting an image of the mask structure onto a light-sensitive substrate, wherein said projection system comprises an optical system comprising an optical axis or a preferred direction given by the direction of a light beam propagating through the optical system, the optical system comprising a temperature compensated polarization-modulating optical element described by coordinates of a coordinate system, wherein one preferred coordinate of the coordinate system is parallel to the optical axis or parallel to said preferred direction;

said temperature compensated polarization-modulating optical element comprising a first and a second polarization-modulating optical element, the first and/or the second polarization-modulating optical element comprising solid and/or liquid optically active material and a profile of effective optical thickness, wherein the effective optical thickness varies at least as a function of one coordinate different from the preferred coordinate of the coordinate system, in addition or alternative the first and/or the second polarization-modulating optical element comprises solid and/or liquid optically active material, wherein the effective optical thickness is constant as a function of at least one coordinate different from the preferred coordinate of the coordinate system;

wherein the first polarization-modulating optical element comprises optically active material with a specific rotation of opposite sign compared to the optically active material of the second polarization-modulating optical element.

Due to the presence of two polarization-modulating optical elements comprising optically active materials having specific rotations of opposite sign, the temperature effects in both these elements at least partially compensate each other, so that the combined system of these two elements has a reduced temperature dependence regarding the change of the polarization. Consequently, even under conditions of temperature variation, a change of the polarization state of light passing both elements is reduced, or the polarization state even remains unchanged. As a consequence of said compensation effect, a detrimental effect of temperature variations on the polarization state of light passing through said system can be reduced or avoided even with relatively large thicknesses (e.g. of several mm) of said elements.

The above compensation concept may particularly be used in a system of two plane plates with a first and a second thickness in the direction of the propagating light beam, said plates being made of optically active quartz with clockwise and counterclockwise specific rotation. Furthermore, according to the present invention said plane plates may have either substantially the same thickness or different thicknesses. In the case of substantial identical thicknesses of the two plane plates, a resulting effect of the whole arrangement of the two plates may be avoided, so that such arrangement is particularly suited e.g. as a polarization-neutral support of a micro-optical element such as a DOE. In the case of different thicknesses of the two plane plates, a resulting effect of the whole arrangement of the two plates can be achieved to provide a polarization-modulating arrangement having, due to the partial compensation effect mentioned before, a relatively weak sensitivity to temperature variations even if relatively large thicknesses for the plane plates are used in view of manufacturing aspects.

Therefore, according to a further aspect the present invention relates to an optical system comprising an optical axis or a preferred direction given by the direction of a light beam propagating through the optical system, the optical system comprising a temperature compensated polarization-modulating optical element described by coordinates of a coordinate system, wherein one preferred coordinate of the coordinate system is parallel to the optical axis or parallel to said preferred direction;

said temperature compensated polarization-modulating optical element comprising a first and a second polarization-modulating optical element, the first and/or the second polarization-modulating optical element comprising solid and/or liquid optically active material and a profile of effective optical thickness, wherein the effective optical thickness varies at least as a function of one coordinate different from the preferred coordinate of the coordinate system, in addition or alternative the first and/or the second polarization-modulating optical element comprises solid and/or liquid optically active material, wherein the effective optical thickness is constant as a function of at least one coordinate different from the preferred coordinate of the coordinate system; wherein the first polarization-modulating optical element comprises optically active material with a specific rotation of opposite sign compared to the optically active material of the second polarization-modulating optical element;

wherein said first and second polarization-modulating optical elements are plane plates with a first and a second thickness in the direction of the propagating light beam, said plates being made of optically active quartz with clockwise and counterclockwise specific rotation; wherein the first and the second thickness are different from each other.

Preferably, the absolute value of the difference of the first and the second thickness is smaller than the thickness of the smaller plate.

According to a further aspect the present invention relates to an optical system having an optical axis, the optical system comprising a first plane plate with a first thickness in the direction of the optical axis and a second plane plate with a second thickness in the direction of the optical axis, wherein said first and second plane plates are made of optically active quartz with specific rotations opposite to each other; and wherein the first and the second thickness are different from each other.

According to a further aspect the present invention relates to a projection system comprising a radiation source, an illumination system operable to illuminate a structured mask, and a projection objective for projecting an image of the mask structure onto a light-sensitive substrate, wherein said projection system comprises an optical system having an optical axis, the optical system comprising a first plane plate with a first thickness in the direction of the optical axis and a second plane plate with a second thickness in the direction of the optical axis; wherein said first and second plane plates are made of optically active quartz with specific rotations opposite to each other.

Further advantageous aspects can be gathered from the following description and the appended claims.

BRIEF DESCRIPTION OF THE DRAWINGS

The invention will hereinafter be explained in more detail with reference to the attached drawings, wherein:

FIG. 4b illustrates the thickness profile as a function of the azimuth angle in the embodiment of the polarization-modulating optical element of FIG. 4a;

DETAILED DESCRIPTION

Figure 1:
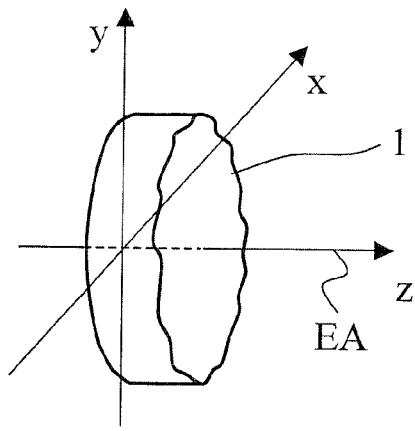
FIG. 1 illustrates a polarization-modulating optical element with a thickness profile.

FIG. 1 illustrates a polarization-modulating optical element 1 of an optically active material. Particularly well suited for this purpose are optically active crystals with at least one optical crystal axis which are transparent for the wavelength of the light being used. For example $TeO_2$ works in a range of wavelengths from 1000 nm down to 300 nm, $AgGaS_2$ works from 500 nm to 480 nm, and quartz from 800 nm down to 193 nm. The polarization-modulating optical element 1 is designed so that the element axis is oriented parallel to the optical crystal axis. In order to produce a selected polarization distribution, the optical element 1 is designed with a thickness profile (measured parallel to the element axis EA) which varies in the directions perpendicular to the element axis EA, also comprising variations in thickness of the optical element in an azimuth direction θ (see FIG. 3) at e.g. a fixed distance of the element axis EA.

Figure 2:
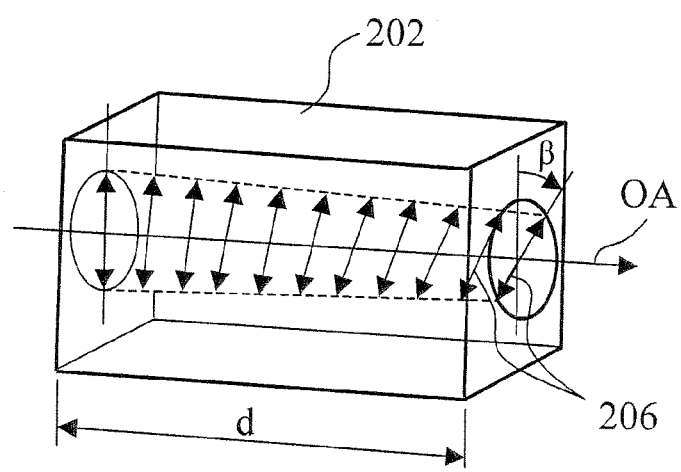
FIG. 2 schematically illustrates how the plane of oscillation is rotated when a linearly polarized light ray propagates along the optical axis in an optically active crystal.

FIG. 2 will serve to explain the function of optically active crystals, and in particular of polarization-modulating elements made from such crystals, in more detail.

Optically active crystals have at least one optical axis OA which is inherent in the crystal structure. When linearly polarized light travels along this optical axis OA, the plane of oscillation of the electrical field vector 206 is rotated by an angle β of proportionate magnitude as the distance d traveled by the light inside the crystal 202. The proportionality factor between distance d and angle of rotation is the specific rotation α. The latter is a material-specific quantity and is dependent on the wavelength of the light rays propagating through the crystal. For example in quartz, the specific rotation at a wavelength of 180 nm was measured as about α=(325.2± 0.5)°/mm, at 193 nm α=323.1°/mm at a temperature of 21.6° C.

It is also important for the present invention, applying optically active materials in an illumination system and/or an objective of a projection optical system of e.g. a projection apparatus used in microlithography, that also the temperature dependency of the specific rotation is considered. The temperature dependency of the specific rotation α for a given wavelength is to a good and first linear approximation given by $α(T)=α_0(T_0)+γ*(T-T_0)$, where γ is the linear temperature coefficient of the specific rotation α. In this case α(T) is the optical activity coefficient or specific rotation at the temperature T and $α_0$ is the specific rotation at a reference temperature $T_0$. For optical active quartz material the value γ at a wavelength of 193 nm and at room temperature is γ=2.36 mrad/(mm*K).

Referring again to FIG. 2, in particular, light that propagates inside the crystal 202 along the optical axis OA is not subject to a linear birefringence. Thus, when a linearly polarized light ray traverses an optically active crystal 202 along the optical axis OA, its state of polarization remains the same except for the change in the spatial orientation of the plane of oscillation of the electrical field vector 206 which depends on the distance d traveled by the light ray inside the crystal 202.

Based on this property of an optically active crystal, it is possible to produce an arbitrarily selected linear polarization distribution by designing the polarization-modulating optical element 1 of FIG. 1 with a thickness profile that varies dependent on the location. The thickness profile is designed to have the effect that the directions of polarization of parallel linearly polarized light rays are rotated by an angle that varies dependent on the location where the light ray traverses the optical element.

More general, alternative or in addition to the variation of the thickness d=d(x,y) of the polarization-modulating element, the specific rotation α may itself be dependent on the location within the modulating element such that α becomes an α(x,y,z) or α(r,θ,z), where x,y or r,θ are Cartesian or polar coordinates in a plane perpendicular to the element axis EA (or alternative to the optical axis OA) of the polarization-modulating element, as shown e.g. in FIG. 1, where z is the axis along the element axis EA. Of course also a description in spherical-coordinates like r,θ,φ, or others is possible. Taking into account the variation of the specific rotation α, the polarization-modulating optical element in general comprises a varying profile of the "optical effective thickness D" defined as D(x,y)=d(x,y)*α(x,y), if there is no dependency of α in z-direction. In the case that α may also depend on the z-direction (along the optical axis or element axis EA, or more general along a preferred direction in an optical system or a direction parallel to the optical axis of an optical system) D has to be calculated by integration D(x,y)=∫α(x,y,z)dz(x,y), along the polarization-modulating optical element. In general, if a polarization-modulating optical element is used in an optical system, having an optical axis or a preferred direction defined by the propagation of a light beam through the optical system, the optical effective thickness D is calculated by integrating the specific rotation α along the light path of a light ray within the polarization-modulating optical element. Under this general aspect the present invention relates to an optical system comprising an optical axis or a preferred direction given by the direction of a light beam propagating through the optical system. The optical system also comprises a polarization-modulating optical element described by coordinates of a coordinate system, wherein one preferred coordinate of the coordinate system is parallel to the optical axis of the optical system or parallel to the preferred direction. As an example, in the above case this preferred direction was the z-coordinate which is the preferred coordinate. Additionally the polarization-modulating optical element comprises optical active material and also a profile of effective optical thickness D as defined above, wherein the effective optical thickness D varies at least as a function of one coordinate different from the preferred coordinate of the coordinate system describing the polarization-modulating optical element. In the above example the effective optical thickness D varies at least as a function of the x- or y-coordinate, different from the z-coordinate (the preferred coordinate). There are different independent methods to vary the effective optical thickness of an optical active material. One is to vary the specific rotation by a selection of appropriate materials, or by subjecting the optically active material to a non-uniform temperature distribution, or by varying the geometrical thickness of the optically active material. Also combinations of the mentioned independent methods result in a variation of the effective optical thickness of an optical active material.

Figure 3:
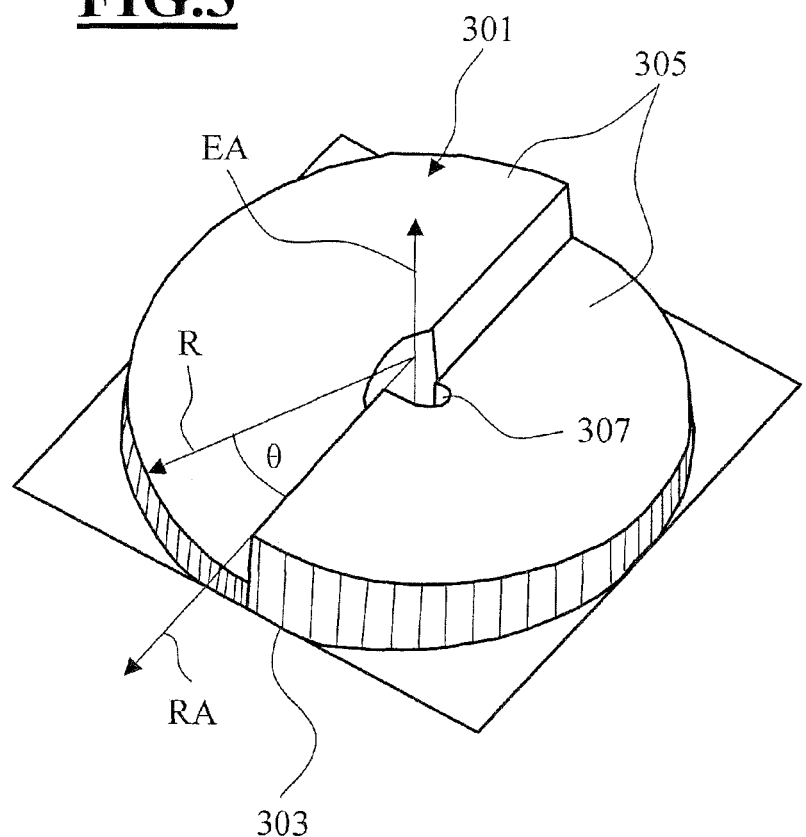
FIG. 3 illustrates a first exemplary embodiment of a polarization-modulating optical element.

FIG. 3 illustrates an embodiment of the polarization-modulating optical element 301 which is suited specifically for producing a tangential polarization. A detailed description will be presented in the context of FIGS. 4d and 5. The embodiment illustrated in FIG. 3 will serve to introduce several technical terms that will be used hereinafter with the specific meanings defined here.

The polarization-modulating optical element 301 has a cylindrical shape with a base surface 303 and an opposite surface 305. The base surface 303 is designed as a planar circular surface. The element axis EA extends perpendicular to the planar surface. The opposite surface 305 has a contour shape in relation to the element axis EA in accordance with a given thickness profile. The optical axis of the optically active crystal runs parallel to the element axis EA. The reference axis RA, which extends in the base plane, intersects the element axis at a right angle and serves as the reference from which the azimuth angle θ is measured. In the special configuration illustrated in FIG. 3, the thickness of the polarization-modulating optical element 301 is constant along a radius R that is perpendicular to the element axis EA and directed at an angle θ relative to the reference axis RA. Thus, the thickness profile in the illustrated embodiment of FIG. 3 depends only on the azimuth angle θ and is given by d=d(θ). The optical element 301 has an optional central bore 307 coaxial with the element axis EA. In another preferred embodiment of the polarization-optical element the thickness may vary along the radius R such that the thickness profile is d=d(R,θ). In a further more generalized preferred embodiment the thickness profile shown in FIG. 3 is not representing the geometrical thickness d of the polarization-optical element, as described above, but the profile represents the optical effective thickness D=D(R,θ)=D(x,y), depending on the used coordinate system. In this case also any profile of the specific rotation like e.g. α=α(x,y)=α(R,θ) or α=α(x,y,z)=α(R,θ,z) is considered in the profile of the polarization-modulating optical element which is effective for a change in the direction of the polarization plane of a passed light beam.

In addition it should be mentioned that the polarization-modulating optical element 301 not necessary need to comprise a planar base surface 303. This surface in general can also comprise a contour shaped surface e.g. similar or equal to the surface as designated by 305 shown in FIG. 3. In such a case it is of advantage to describe the contour surfaces 303 and 305 relative to a plane surface perpendicular to the optical axis or element axis.

Figure 4A:
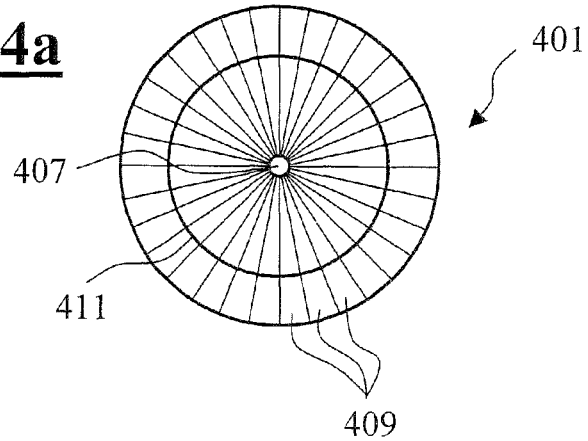
FIG. 4a schematically illustrates a second exemplary embodiment of a polarization-modulating optical element.

FIG. 4a schematically illustrates a further embodiment of the polarization-modulating optical element 401. The element axis EA through the center of the polarization-modulating optical element 401 in this representation runs perpendicular to the plane of the drawing, and the optical crystal axis of the crystal runs parallel to the element axis. Like the embodiment of FIG. 3, the polarization-modulating optical element 401 has an optional central bore 407. The polarization-modulating optical element 401 is divided into a large number of planar-parallel portions 409 in the shape of sectors of a circle which differ in their respective thicknesses. Alternative embodiments with different shapes of the portions 409 are conceivable. They could be configured, e.g., as hexagonal, square, rectangular or trapeze-shaped raster elements.

As described in connection with FIG. 3, the embodiment according to FIG. 4a can be modified such that the different thicknesses of the sectors should be understood as different effective optical thicknesses D. In this case the specific rotation α may vary from one segment to the other too. To manufacture such an embodiment, the polarization-modulating optical element can e.g. have a shape as shown in FIG. 4a in which the sectors 409 are at least partly exchanged e.g. by any optical inactive material, which is the simplest case to vary the specific rotation α to zero. Also as a further embodiment the sectors 409 may be replaced by cuvettes or cells which are filed with an optical active or optical inactive liquid. In this case the polarization-modulating optical element may comprise optical active and optical inactive sections. If the sectors 409 are only party replaced by cuvettes or if at least one cuvette is used in the polarization-modulating optical element 401, a combination of e.g. optical active crystals with e.g. optical active or optical inactive liquids in one element 40 is possible. Such an optical system according to the present invention may comprise a polarization-modulating optical element which comprises an optically active or an optically inactive liquid and/or an optically active crystal. Further, it is advantageously possible that the polarization-modulating optical element of the optical system according to the present invention comprises clockwise and counterclockwise optically active materials. These materials could be solid or liquid optically active materials. Using liquids in cuvettes has the advantage that by changing the liquids, or the concentration of the optical active material within the liquid, the magnitude of the change in polarization can be easily controlled. Also any thermal changes of the specific rotation α due to the thermal coefficient γ of the specific rotation α can be controlled e.g. by temperature control of the optical active liquid such that either the temperature is constant within the cuvette, or that the temperate has predefined value T such that the specific rotation will have the value $\alpha(T)=\alpha_0(T_0)+\gamma^*(T-T_0)$. Also the formation of a certain temperature distribution within the liquid may be possible with appropriate heating and/or cooling means controlled by control means.

The optical systems in accordance with the present invention advantageously modify respective planes of oscillation of a first linearly polarized light ray and a second linearly polarized light ray. Both light rays propagating through the optical system, and being at least a part of the light beam propagating through the optical system. The light rays are also passing the polarization-modulating optical element with different paths, and are rotated by a respective first and second angle of rotation such that the first angle is different of the second angle. In general the polarization-modulating optical element of the optical systems according to the present invention transforms a light bundle with a first linear polarization distribution, which enters said polarization-modulating optical element, into a light bundle exiting said polarization-modulating optical element. The exiting light bundle has a second linear polarization distribution, wherein the second linear polarization distribution is different from the first linear polarization distribution.

Figure 4B:
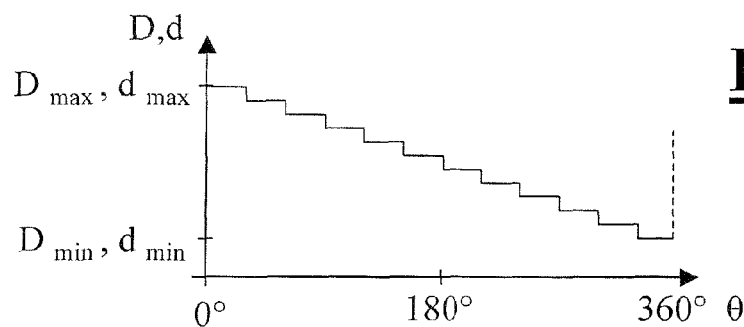

FIG. 4b shows the thickness profile along an azimuthal section d(r=const.,θ) for the polarization-modulating optical element 401 divided into sectors as shown in FIG. 4a. The term azimuthal section as used in the present context means a section traversing the thickness profile d(θ,r) along the circle 411 marked in FIG. 4a, i.e., extending over an azimuth angle range of $0° \leq \theta \leq 360°$ at a constant radius r. In general the profile shows the optical effective thickness $D=D(\theta)$ along a circle 411.

An azimuthal section of a polarization-modulating optical element 401 that is divided into sector-shaped portions has a stair-shaped profile in which each step corresponds to the difference in thickness d or optical effective thickness D between neighbouring sector elements. The profile has e.g. a maximum thickness $d_{max}$ and a minimum thickness $d_{min}$. In order to cover a range of $0 \leq \beta \leq 360°$ for the range of the angle of rotation of the oscillation plane of linearly polarized light, there has to be a difference of 360°/α between $d_{max}$ and $d_{min}$. The height of each individual step of the profile depends on the number n of sector elements and has a magnitude of 360°/(n·α). At the azimuth angle θ=0°, the profile has a discontinuity where the thickness of the polarization-modulating optical element 401 jumps from $d_{min}$ to $d_{max}$. A different embodiment of the optical element can have a thickness profile in which an azimuthal section has two discontinuities of the thickness, for example at θ=0° and θ=180°.

In an alternative embodiment the profile has e.g. a maximum optical effective thickness $D_{max}$ and a minimum optical effective thickness $D_{min}$, and the geometrical thickness d is e.g. constant, resulting in a variation of the specific rotation α of the individual segments 409 of the element 401. In order to cover a range of $0 \leq \beta \leq 360°$ for the range of the angle of rotation of the oscillation plane of linearly polarized light, there has to be a difference of 360°/d between $\alpha_{max}$ and $\alpha_{min}$. The change of the specific rotation of each individual step of the profile depends on the number n of sector elements 409 and has a magnitude of 360°/(n·d). At the azimuth angle θ=0°, the profile has a discontinuity regarding the optical effective thickness where it jumps from $D_{min}$ to $D_{max}$. It should be pointed out, that advantageously in this embodiment there is no discontinuity in the geometrical thickness d of the polarization-modulating element 401. Also the thickness profile of the optical effective thickness in which an azimuthal section has two discontinuities of the optical effective thickness can easily be realized, for example at θ=0° and θ=180°. To realize the defined changes in magnitude of the specific rotation of Δα=360°/(n·d) (if there a n angular segments 409 to form the element 401), the individual sector elements 409 are preferably made of or comprises cuvettes or cells, filled with an optical active liquid with the required specific rotation α. As an example, for the m-th sector element the specific rotation is $\alpha(m)=\alpha_{min}+m*360°/(n·d)$, and $0 \leq m \leq n$. The required specific rotation e.g. can be adjusted by the concentration of the optical active material of the liquid, or by changing the liquid material itself.

In a further embodiment the segments 409 of a polarization-modulating optical element 401 may comprise components of solid optically active material (like crystalline quartz) and cells or cuvettes filled with optically active material, and these components are placed behind each other in the light propagation direction. Alternative or in addition the cuvette itself may comprise optically active material like crystalline quartz.

The polarization-modulating optical element of the foregoing description converts linearly polarized incident light into a linear polarization distribution in which the oscillation planes of linearly polarized light rays are rotated by an angle that depends on the thickness (or optical effective thickness) of each individual sector element. However, the angle by which the direction of polarization is rotated is constant over an individual sector element. Thus, the distribution function for the directions of the oscillation planes of the individual field vectors takes only certain discrete values.

A continuous distribution of linear polarizations can be achieved with an optical element that has a continuously varying thickness (optical effective thickness) profile along an azimuthal section.

Figure 4C:
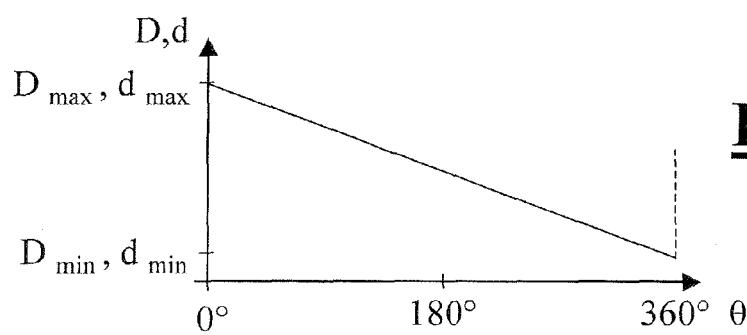
FIG. 4c illustrates the thickness profile as a function of the azimuth angle in a further embodiment of the polarization-modulating optical element.

An example of a continuously varying thickness profile is illustrated in FIG. 4c. The azimuthal section 411 in this embodiment shows a linear decrease in thickness (in general optical effective thickness) with a slope m=−180°/(α·π) over an azimuth-angle range of $0 \leq \theta \leq 360°$. Here the slope is defined a slope of a screw. Alternatively the slope can be defined by m=−180°/(α*π*r) where r is the radius of a circle centred at the element axis EA. In this case the slope depends on the distance of the element axis, e.g. if the polarization-modulating optical element 301 has a given constant screw-slope (lead of a screw).

The symbol α in this context stands for the specific rotation of the optically active crystal. As in the previously described embodiment of FIG. 4b, the thickness profile of FIG. 4c has likewise a discontinuity at the azimuth angle θ=0°, the thickness of the polarization-modulating optical element 401 jumps from $d_{min}$ to $d_{max}$ by an amount of approximately 360°/α.

Figure 4D:
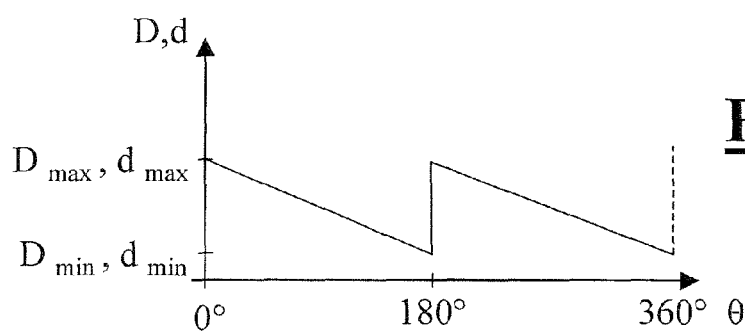
FIG. 4d illustrates the thickness profile as a function of the azimuth angle in the embodiment of the polarization-modulating optical element of FIG. 3.

A further embodiment of a polarization-modulating optical element which is shown in FIG. 4d has a thickness profile (in general optical effective thickness profile) which is likewise suitable for producing a continuous distribution of linear polarizations, in particular a tangentially oriented polarization. This thickness profile corresponds to the embodiment shown in FIG. 3, in which the angle θ is measured in counterclockwise direction. The azimuthal section 411 in this embodiment is a linear function of the azimuth angle θ with a slope m=−180°/(α·π) over each of two ranges of 0<θ<180° and 180°<θ<360°. The thickness profile has discontinuities at θ=0° and θ=180° where the thickness rises abruptly from $d_{min}$ to $d_{max}$ by an amount of 180°/α.

Figure 4E:
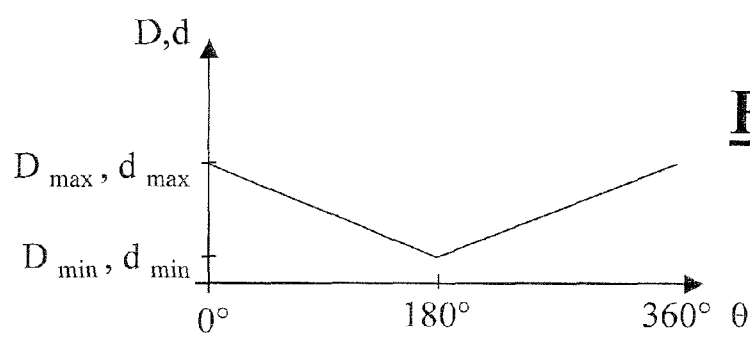
FIG. 4e illustrates the thickness profile as a function of the azimuth angle in a further embodiment of the polarization-modulating optical element.

FIG. 4e represents the thickness profile (in general optical effective thickness profile) along an azimuthal section for a further embodiment of the polarization-modulating optical element 401. The azimuthal section is in this case a linear function of the azimuth angle θ with a first slope m for 0<θ<180° and with a second slope n for 180°<θ<360°. The slopes m and n are of equal absolute magnitude but have opposite signs. The respective amounts for m and n at a distance r from the element axis are m=−180°/(α·π·r) and n=180°/(α·π·r). While the difference between the minimum thickness $d_{min}$ and the maximum thickness $d_{max}$ is again approximately 180°/α, i.e., the same as in the embodiment of FIG. 4d, the concept of using opposite signs for the slope in the two azimuth angle ranges avoids the occurrence of discontinuities.

Additionally it is mentioned that for certain special applications clockwise and counterclockwise optically active materials are combined in a polarization-modulating optical element.

As the slope of the thickness profile along an azimuthal section increases strongly with smaller radii, it is advantageous from a manufacturing point of view to provide a central opening 407 or a central obscuration in a central portion around the central axis of the circular polarization-modulating optical element.

It is furthermore advantageous for reasons of mechanical stability to design the polarization-modulating optical element with a minimum thickness $d_{min}$ of no less than two thousandths of the element diameter. It is particularly advantageous to use a minimum thickness of $d_{min}=N\cdot 90°/\alpha$, where N is a positive integer. This design choice serves to minimize the effect of birefringence for rays of an incident light bundle which traverse the polarization-modulating element at an angle relative to the optical axis.

Figure 4F:
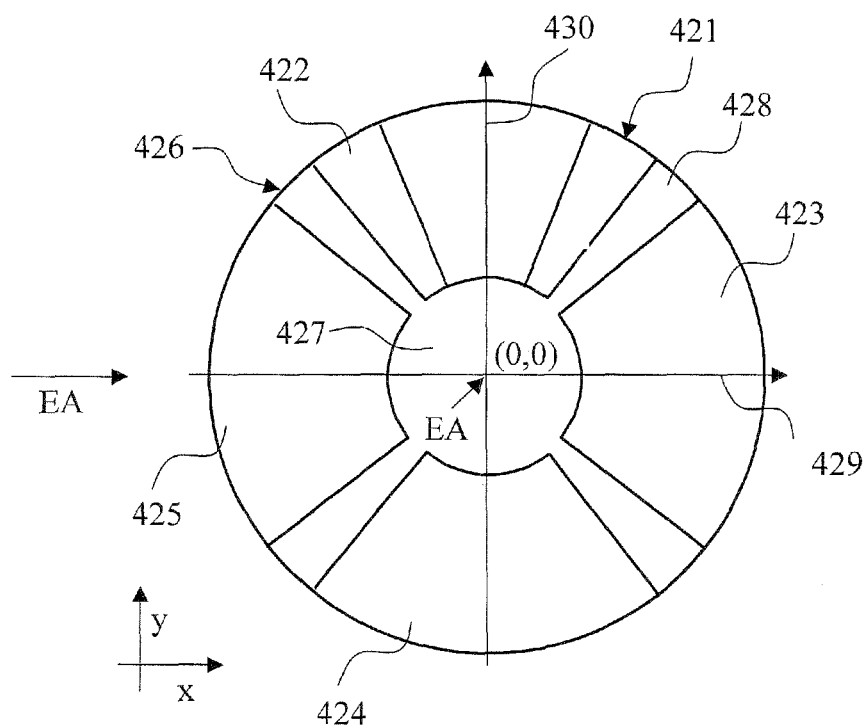
FIG. 4f schematically illustrates a further exemplary embodiment of a polarization-modulating optical element.

FIG. 4f schematically illustrates a further embodiment 421 of the polarization-modulating optical element. As in FIG. 4a, the element axis EA through the center of the polarization-modulating optical element 421 runs perpendicular to the plane of the drawing, and the optical crystal axis runs parallel to the element axis. However, in contrast to the embodiments of FIGS. 3 and 4a where the polarization-modulating optical elements 301, 401 are made preferably of one piece like in the case of crystalline material like crystalline quartz, the polarization-modulating optical element 421 comprises of four separate sector-shaped parts 422, 423, 424, 425 of an optically active crystal material which are held together by a mounting device 426 which can be made, e.g., of metal and whose shape can be described as a circular plate 427 with four radial spokes 428. The mounting is preferably opaque to the radiation which is entering the polarization-modulating optical element, thereby serving also as a spacer which separates the sector-shaped parts 422, 423, 424, 425 from each other. Of course the embodiment of the present invention according to FIG. 4f is not intended to be limited to any specific shape and area of mounting device 426, which may also be omitted.

According to an alternate embodiment not illustrated in FIG. 4f, incident light which is entering the polarization-modulating optical element can also be selectively directed onto the sector-shaped parts, e.g. by means of a diffractive structure or other suitable optical components.

The sector-shaped parts 422 and 424 have a first thickness d1 which is selected so that the parts 422 and 424 cause the plane of oscillation of linearly polarized axis-parallel light to be rotated by $90°+p\cdot 180°$, where p represents an integer. The sector-shaped parts 423 and 425 have a second thickness d2 which is selected so that the parts 423 and 425 cause the plane of oscillation of linearly polarized axis-parallel light to be rotated by $q\cdot 180°$, where q represents an integer other than zero. Thus, when a bundle of axis-parallel light rays that are linearly polarized in the y-direction enters the polarization-modulating optical element 421, the rays that pass through the sector-shaped parts 423 and 425 will exit from the polarization-modulating optical element 421 with their plane of oscillation unchanged, while the rays that pass through the sector-shaped parts 422 and 424 will exit from the polarization-modulating optical element 421 with their plane of oscillation rotated into the x-direction. As a result of passing through the polarization-modulating optical element 421, the exiting light has a polarization distribution which is exactly tangential at the centrelines 429 and 430 of the sector-shaped parts 422, 423, 424, 425 and which approximates a tangential polarization distribution for the rest of the polarization-modulating optical element 421.

When a bundle of axis-parallel light rays that are linearly polarized in the x-direction enters the polarization-modulating optical element 421, the rays that pass through the sector-shaped parts 423 and 425 will exit from the polarization-modulating optical element 421 with their plane of oscillation unchanged, while the rays that pass through the sector-shaped parts 422 and 424 will exit from the polarization-modulating optical element 421 with their plane of oscillation rotated into the y-direction. As a result of passing through the polarization-modulating optical element 421, the exiting light has a polarization distribution which is exactly radial at the centrelines 429 and 430 of the sector-shaped parts 422, 423, 424, 425 and which approximates a radial polarization distribution for the rest of the polarization-modulating optical element 421.

Of course the embodiment of the present invention according to FIG. 4f is not intended to be limited to the shapes and areas and the number of sector-shaped parts exemplarily illustrated in FIG. 4f, so that other suitable shapes (having for example but not limited to trapeze-shaped, rectangular, square, hexagonal or circular geometries) as well as more or less sector-shaped parts 422, 423, 424 and 425 can be used. Furthermore, the angles of rotation $\beta_1$ and $\beta_2$ provided by the sector-shaped parts 422, 423, 424, 425 (i.e. the corresponding thicknesses of the sector-shaped parts 422, 423, 424, 425) may be more generally selected to approximately conform to the expression $|\beta_2-\beta_1|=(2n+1)\cdot 90°$, with n representing an integer, for example to consider also relative arrangements where incoming light is used having a polarization plane which is not necessarily aligned with the x- or y-direction. With the embodiments as described in connection with FIG. 4f it is also possible to approximate polarization distributions with a tangential polarization.

In order to produce a tangential polarization distribution from linearly polarized light with a wave length of 193 nm and a uniform direction of the oscillation plane of the electric field vectors of the individual light rays, one can use for example a polarization-modulating optical element of crystalline quartz with the design according to FIGS. 3 and 4d. The specific rotation $\alpha$ of quartz for light with a wavelength of 193 nm is in the range of $(325.2\pm 0.5)°/mm$, which was measured at a wavelength of 180 nm, or more precise it is $321.1°/mm$ at $21.6°$ C. The strength and effect of the optical activity is approximately constant within a small range of angles of incidence up to 100 mrad. An embodiment could for example be designed according to the following description: An amount of 276.75 μm, which approximately equals $90°/\alpha$, is selected for the minimum thickness $d_{min}$, if crystalline quartz is used. Alternatively, the minimum thickness $d_{min}$ can also be an integer multiple of this amount. The element diameter is 110 mm, with the diameter of the optically active part being somewhat smaller, for example 105 mm. The base surface is designed as a planar surface as illustrated in FIG. 3. The opposite surface has a thickness profile $d(r,\theta)$ in accordance with FIG. 4d. The thickness profile is defined by the following mathematical relationships:

$$D(r, \theta) = 276.75 + \frac{180° - \theta}{180°} \cdot 553.51 \text{ μm for } 0 \leq \theta \leq 180° \text{ and } r > \frac{10.5}{2} \text{ mm}$$

$$D(r, \theta) = 276.75 + \frac{360° - \theta}{180°} \cdot 553.51 \text{ μm for } 180 \leq \theta \leq 360° \text{ and } r > \frac{10.5}{2} \text{ mm}$$

$$D(r, \theta) = 0 \text{ for } r \leq \frac{10.5}{2} \text{ mm}$$

The above mentioned data are based exemplarily for a specific rotation α of (325.2±0.5)°/mm. If the specific rotation α changes to 321.1°/mm, the value at 193 nm and at a temperature of 21.6° C., the thickness profile will change as follows:

$$D(r, \theta) = 278.6 + \frac{180° - \theta}{180°} \cdot 557 \ \mu m \text{ for } 0 \le \theta \le 180° \text{ and } r > \frac{10.5}{2} \text{ mm}$$

$$D(r, \theta) =$$
$$278.6 + \frac{360° - \theta}{180°} \cdot 557 \ \mu m \text{ for } 180 \le 0 \le 360° \text{ and } r > \frac{10.5}{2} \text{ mm}$$

$$D(r, \theta) = 0 \text{ for } r \le \frac{10.5}{2} \text{ mm}$$

The polarization-modulating optical element according to this embodiment has a central opening 407 with a diameter 10.5, i.e., one-tenth of the maximum aperture. The thickness maxima and minima, which are found at the discontinuities, are 830.26 μm and 276.75 μm, respectively for the first given example.

The embodiment of the foregoing description can be produced with a robot-polishing process. It is particularly advantageous to produce the polarization-modulating element from two wedge-shaped or helically shaped half-plates which are seamlessly joined together after polishing. If the element is produced by half-plates, it is easy and in some applications of additional advantage to use one clockwise and one counter-clockwise optically active material like clockwise crystalline and counterclockwise crystalline quartz (R-quartz and L-quartz).

Figure 4G:
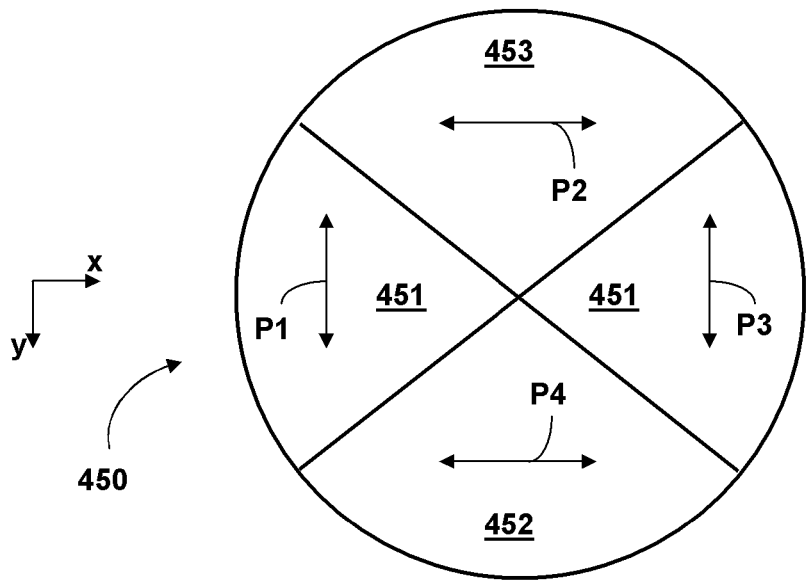
FIG. 4g-h schematically illustrate a further exemplary embodiment of a polarization-modulating optical element in a plan view (FIG. 4g) and a front-side view (FIG. 4h)
Figure 4H:
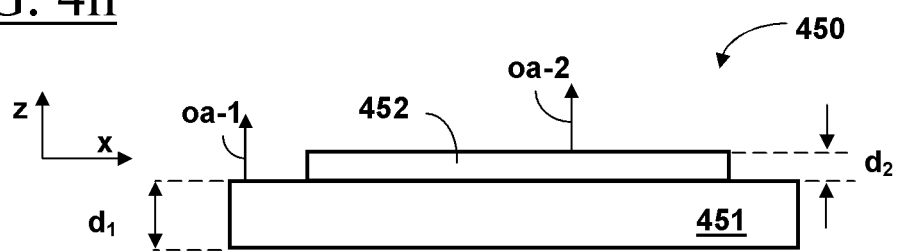

FIGS. 4g and 4h schematically show a further preferred embodiment of a polarization-modulating element 450 in a plan-view (FIG. 4g) and a front-side view (FIG. 4h). The polarization-modulating element 450 of FIG. 4g comprises a support plate 451 and two sector-shaped parts 452 and 453 which are fixed, by means of wringing, on said support plate 451.

The embodiment of FIG. 4g,h is characterized in that the support plate 451 is made of optically active crystalline quartz, with the optical crystal axis being perpendicular to the surface of the support plate 451, i.e. parallel to the z-direction in the coordinate system also shown in FIG. 4g,h. The direction of the optical crystal axis in the support plate 451 is also shown in FIG. 4h and referenced with "oa-1". Furthermore, and like in the embodiment described with reference to FIG. 4f, the sector-shaped parts 452 and 453 are also made of optically active crystalline quartz, with the optical crystal axis being perpendicular to their surface, i.e. also parallel to the z-direction. The direction of the optical crystal axis in the sector-shaped parts 452 and 453 is also shown in FIG. 4h and referenced with "oa-2".

The thickness $d_2$ of the sector-shaped parts 452 and 453 is such that the orientation of polarization of linearly polarized light with normal incidence on the light entrance side of the polarization-modulating element 450 is rotated by an angle of 90°. The thickness $d_1$ of the support plate 451 is such that the orientation of polarization of linearly polarized light with normal incidence on the light entrance side of the support plate 451 is rotated by an angle of q*180°, with q being an integer larger than zero. For use of synthetic, optically active crystalline quartz having a specific rotation of 323.1°/mm for a wavelength of 193 nm and a temperature of 21.6° C., this condition means that the thickness d of the support plate is $d_1 \approx q*557 \ \mu m$. As a consequence, the support plate 451 behaves neutral with respect to the effect of the polarization-modulating element 450 in the sense that the polarization distribution of light entering the light entrance side of the support plate 451 with normal incidence is identical to the polarization distribution of this light after having passed the support plate 451, i.e. at the light exit side of the support plate 451.

A significant advantage of this embodiment using the above-described support plate 451 made of optically active quartz is that an enhanced durability of the wringing-connection between the support plate 451 and sector-shaped parts 452 and 453 can be achieved, in particular under varying temperature conditions. The enhanced stability or durability of the wringing-connection is a result from the fact that the support plate 451 and the sector-shaped parts 452 and 453 are not only made from the same material, but also have, in addition to the identity of materials, the same crystal orientation. In the crystal orientation according to the configuration shown in FIGS. 4g and 4h, physical properties as the refraction numbers or expansion coefficients of the optically active quartz material in the support plate 451 and the sector-shaped parts 452 and 453 are rotational symmetric with regard to the respective optical crystal axis. In particular, the thermal expansion coefficients of the support plate 451 and the sector-shaped parts 452 and 453 are identical. Therefore, if the temperature changes in the direct environment of the contact region between the support plate 451 and the sector-shaped parts 452 and 453 (e.g. due to laser irradiation during the microlithography process or during applying antireflection coatings), the temperature increase and the thermal expansion are the same in the support plate 451 and the sector-shaped parts 452 and 453, so that the risk of a temperature- or stress-induced loose of contact between these element is significantly reduced or eliminated, if e.g. compared to the use of a support plate made of $CaF_2$ or fused silica.

In the embodiment illustrated in FIGS. 4g and 4h, the support plate 451 and the sector-shaped parts 452 and 453 are all made of right-handed optically active quartz. The invention is however not limited thereto. Alternatively, the support plate 451 and the sector-shaped parts 452 and 453 can be made of left-handed optically active quartz. In a further preferred embodiment, the support plate 451 is made of right-handed optically active quartz, and the sector-shaped parts 452 and 453 are made of left-handed optically active quartz, or vice versa. An advantage of the use of both R-quartz and L-quartz is that the sector-shaped parts 452 and 453 (or the combined system of the support plate 451 and the sector-shaped parts 452 and 453) will have a reduced temperature dependence regarding the change of polarization, since the temperature dependence of the polarization state becomes partly compensated. This advantageous effect is explained in more detail below with respect to FIG. 11.

Furthermore, although in the embodiment as shown in FIGS. 4g and 4h the thicknesses of the sector-shaped parts 452 and 453 and the support plate 451 are such that the orientation of polarization of linearly polarized light with normal incidence on the light entrance side of the polarization-modulating element 450 is rotated by an angle of 90° in the sector-shaped parts 452 and 453, and by an angle of 180° in the support plate 451, the invention is not limited thereto. In an alternate embodiment, the thicknesses $d_1$, $d_2$ of the sector-shaped parts 452 and 453 and the support plate 451 may e.g. be such that the orientation of polarization of linearly polarized light with normal incidence on the light entrance side of the polarization-modulating element 450 is rotated by an angle of 180° in the sector-shaped parts 452 and 453, and by an angle of 90° (or more generally an angle of 90°+k*180°, with k being an integer≧0) in the support plate 451. In a further, more general embodiment, the thickness of the support plate 451 may be such that the orientation of polarization of linearly polarized light with normal incidence on the light entrance side of the polarization-modulating element 450 is rotated by an angle of k*90°.

In FIG. 4g, the directions of polarization of light that exits from the polarization-modulating element 450 (and which has entered the polarization-modulating element 450 as linear polarized light with polarization along the y-axis) are referenced with double-arrows "P1" to "P4". It can be seen that the embodiment as shown in FIGS. 4g and 4h may be used to approximate a tangential polarization direction for the exiting light bundle. However, although in the embodiment according to FIGS. 4g and 4h the polarization-modulating element 450 comprises two sector-shaped parts 452 and 453 being arranged on the support plate 451, the invention is not limited to the shapes and areas and the number of sector-shaped parts. Other suitable shapes (having for example but not limited to trapeze-shaped, rectangular, square, hexagonal or circular geometries) as well as more or less sector-shaped parts can be used in the embodiment of FIGS. 4g and 4h in order to create a desired polarization distribution.

Figure 5:
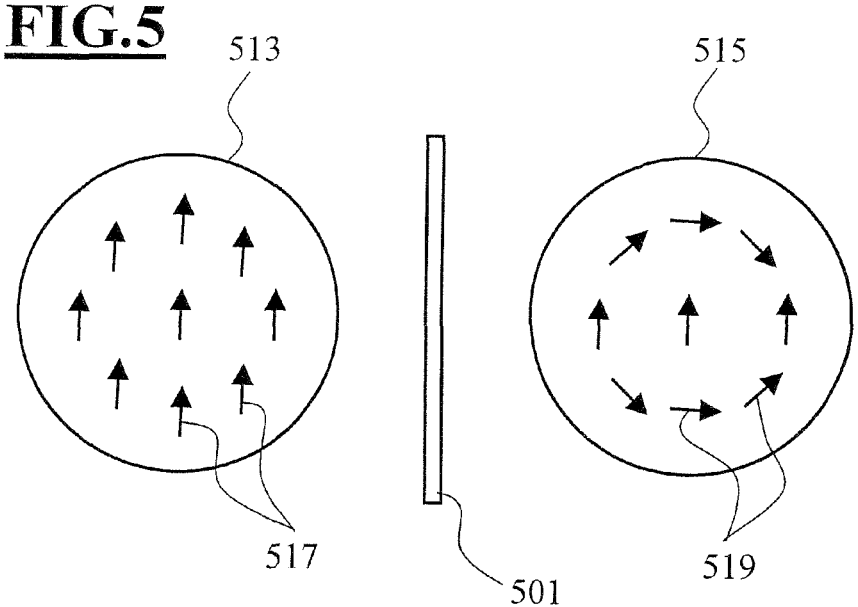
FIG. 5 schematically illustrates the polarization distribution of a bundle of light rays before and after passing through the polarization-modulating optical element with the thickness profile according to FIG. 3 or 4d.

FIG. 5 schematically illustrates how a polarization-modulating optical element 501 with a thickness profile according to FIGS. 3 and 4d converts the polarization distribution of an entering light bundle 513 with a uniformly oriented linear polarization distribution 517 into a tangential polarization 519 of an exiting light bundle 515. This can be visualized as follows: A linearly polarized light ray of the entering light bundle 513 which traverses the polarization-modulating optical element at a location of minimum thickness, for example at $\theta=180°$, covers a distance of $90°/\alpha$ inside the optically active crystal. This causes the oscillation plane of the electrical field vector to be rotated by 90°. On the other hand, a linearly polarized light ray traversing the polarization-modulating optical element 501 at a location with $\theta=45°$ covers a distance of $135°/\alpha$ inside the optically active crystal, thus the oscillation plane of the electrical field vector of this ray is rotated by 135°. Analogous conclusions can be drawn for each light ray of the entering light bundle 513.

Figure 6:
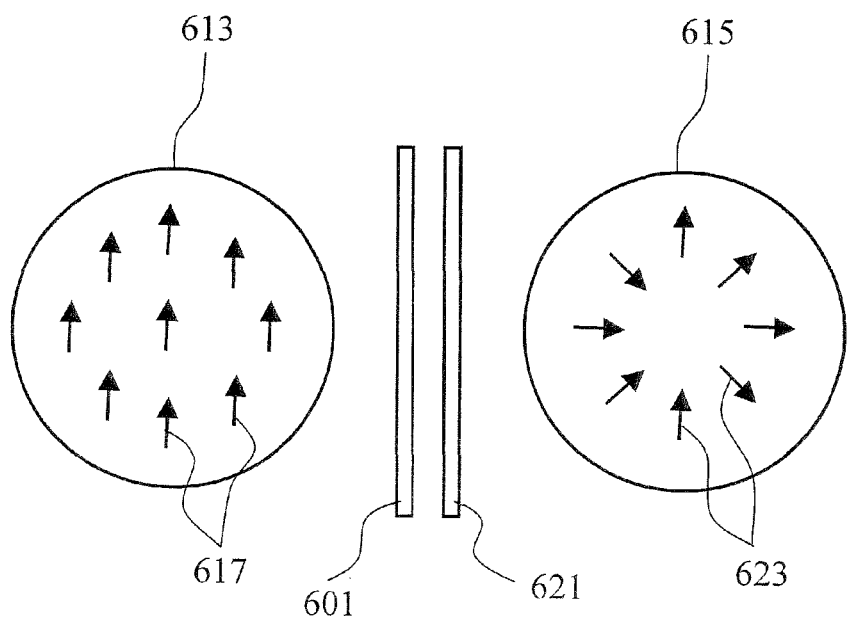
FIG. 6 schematically illustrates the polarization distribution of a bundle of light rays before and after passing through an optical arrangement with the polarization-modulating optical element with the thickness profile according to FIG. 3 and a further polarization-modulating optical element.

FIG. 6 schematically illustrates how an optical arrangement with a polarization-modulating optical element 601 with a thickness profile according to FIGS. 3 and 4d in combination with a further polarization-modulating element 621 converts the polarization distribution of an entering light bundle 613 with a uniformly oriented linear polarization distribution 617 into a radial polarization 623 of an exiting light bundle 615. As explained in the context of FIG. 5, the polarization-modulating optical element 601 produces a tangential polarization distribution. A tangential polarization distribution can be converted into a radial polarization distribution by a 90°-rotation of the respective oscillation plane of each individual linearly polarized ray of the light bundle. There are several different possibilities to accomplish this with an optical arrangement according to FIG. 6. One possible concept is to arrange a planar-parallel plate of an optically active crystal as a further polarization-modulating element 621 in the light path, where the thickness of the plate is approximately $90°/\alpha_p$ with $\alpha_p$ representing the specific rotation of the optically active crystal. As in the polarization-modulating element 601, the optical crystal axis of the planar parallel plate runs likewise parallel to the element axis. As another possible concept, the further polarization-modulating element 621 can be configured as a 90°-rotator that is assembled from two half-wave plates. A 90°-rotator consists of two half-wave plates of birefringent crystal material. Each plate has a slow axis associated with the direction of the higher refractive index and, perpendicular to the slow axis, a fast axis associated with the direction of the lower refractive index. The two half-wave plates are rotated relative to each other so their respective fast and slow axes are set at an angle of 45° from each other.

Of course further possible embodiments for producing a radial polarization distribution are conceivable within the scope of the invention. For example, the further polarization-modulating optical element 621 can be connected to the polarization-modulating optical element 601. To allow a fast change-over from tangential to radial polarization, one could provide an exchange device that allows the further polarization-modulating element 621 to be placed in the light path and to be removed again or to be replaced by another element.

Figure 7A:
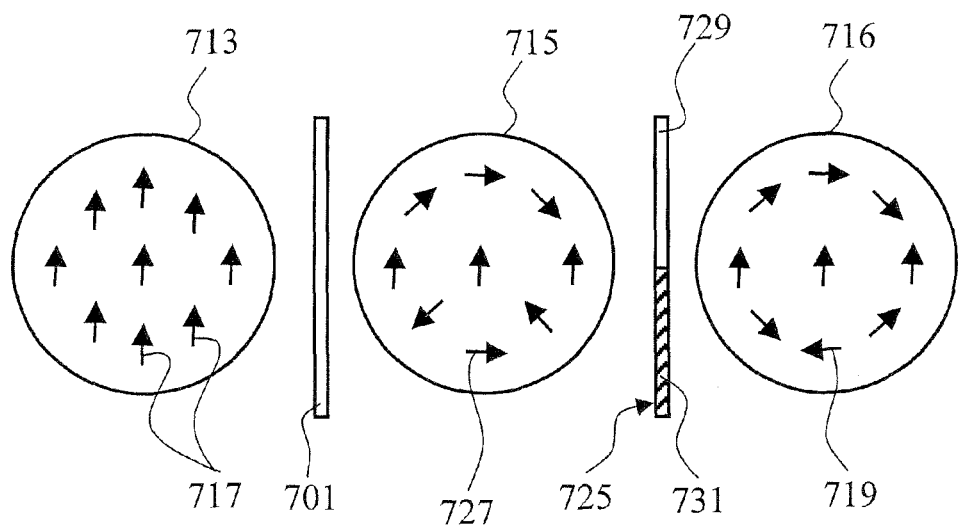
FIG. 7a schematically illustrates the polarization distribution of a bundle of light rays before and after passing through an optical arrangement with the polarization-modulating optical element with the thickness profile according to FIG. 4e and a planar-parallel plate, one half of which is configured as a half-wave plate.
Figure 7B:
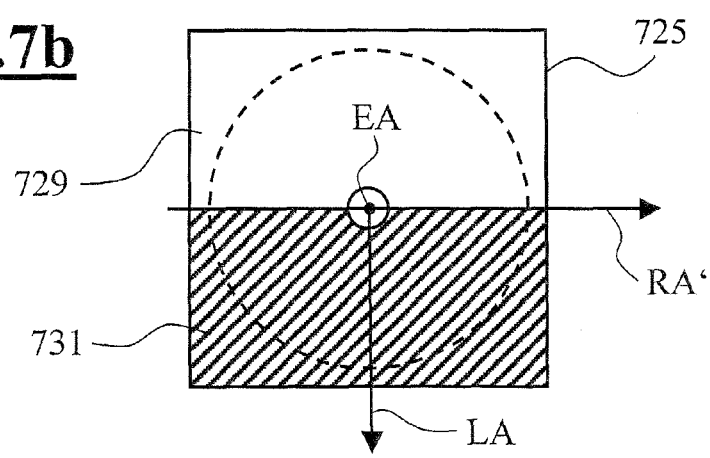
FIG. 7b shows a plan view of a planar-parallel plate, one half of which is configured as a half-wave plate.

A tangential polarization distribution can also be produced with a polarization-modulating optical element that has a thickness profile in accordance with FIG. 4e. The thickness profile in this embodiment of the invention has no discontinuities. As visualized in FIG. 7a, the uniformly oriented polarization distribution 717 of the entering light bundle 713 is first transformed by the polarization-modulating optical element 701 into a linear polarization distribution 727 of an exiting light bundle 715. The one-half of the entering light bundle 713 that passes through the polarization-modulating optical element 701 in the azimuth range $0 \leq \theta \leq 180°$ of the thickness profile shown in FIG. 4e is converted so that the corresponding one-half of the exiting light bundle has a tangential polarization distribution. The other half, however, has a different, non-tangential polarization distribution 727. A further polarization-modulating optical element is needed in the light path in order to completely convert the polarization distribution 727 of the light bundle 715 exiting from the polarization-modulating optical element 701 into a tangential polarization distribution 719. The further polarization-modulating optical element is in this case configured as a planar-parallel plate 725 with a first half 729 and a second half 731. A plan view of the planar-parallel plate 725 is shown in FIG. 7b. The first half 729 is made of an isotropic material that has no effect on the state of polarization of a light ray, while the second half 731 is designed as a half-wave plate. The planar-parallel plate 725 in the optical arrangement of FIG. 7a is oriented so that a projection RA' of the reference axis RA of the polarization-modulating optical element 701 onto the planar-parallel plate runs substantially along the separation line between the first half 729 and the second half 731. The slow axis LA of the birefringence of the half-wave plate is perpendicular to this separation line. Alternatively tangential polarization can also be achieved with a polarization-modulating optical element, having a thickness profile as given by FIG. 4e, if the element is composed of two half wedge-shaped or helically shaped elements of crystalline quartz, wherein the optical activity of one element is clockwise and that of the other is counterclockwise. In this case no additional plane-parallel plate 725 is necessary, as it is in the embodiment of FIG. 7a. In this embodiment preferably each wedge-shaped element has a constant screw-slope, but the slopes have different directions as shown in the profile of FIG. 4e. Further, it is not necessary that the slopes of the geometrical thickness d have the same absolute values, it is sufficient if the slopes D of the optical effective thicknesses have the same absolute values. In this case the specific rotations $\alpha$ are different regarding absolute values for the two wedge-shaped elements which form the polarization-modulating optical element.

Figure 8:
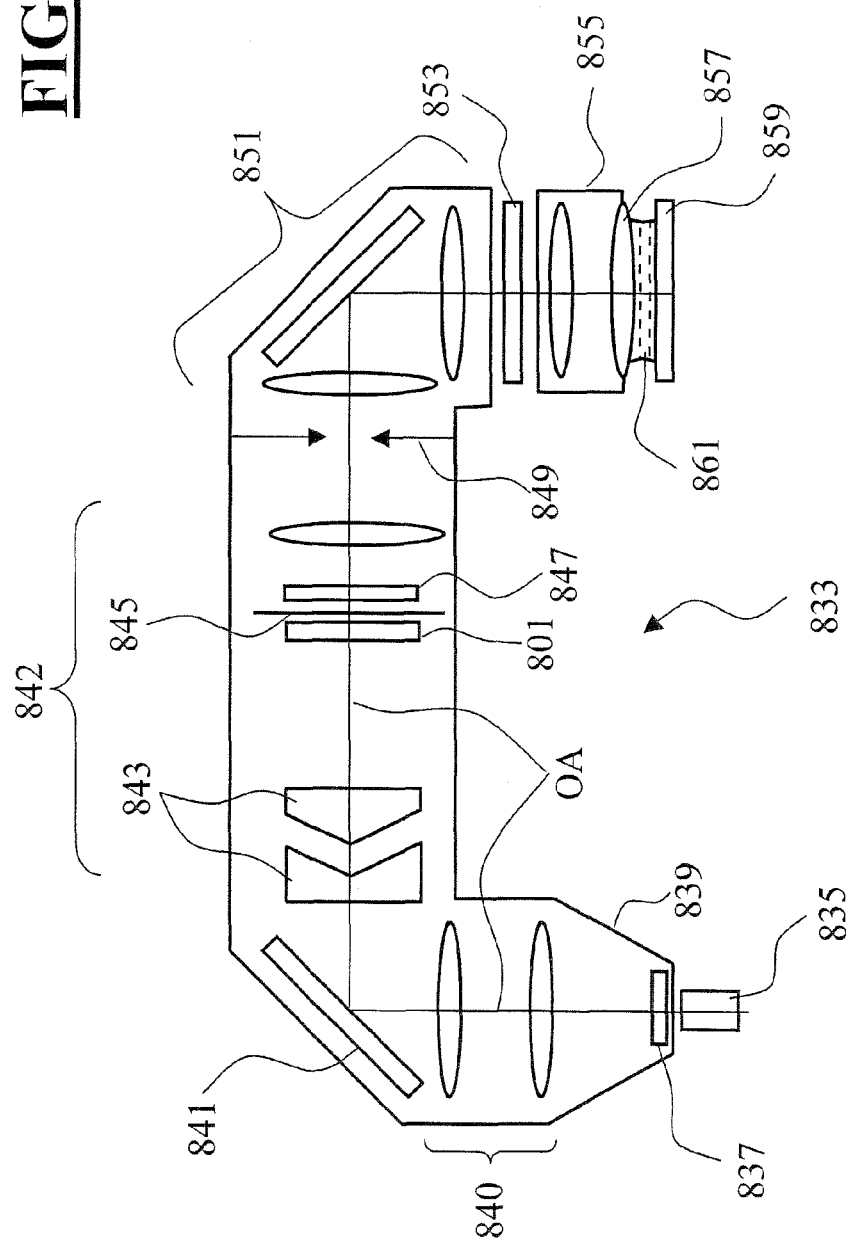
FIG. 8 schematically illustrates a microlithography projection system with a polarization-modulating optical element.

FIG. 8 schematically illustrates a microlithography projection system 833 which includes the light source unit 835, the illumination system 839, the mask 853 which carries a microstructure, the projection objective 855, and the substrate 859 that is being exposed to the projection. The light source unit 835 includes a DUV- or VUV-laser, for example an ArF laser for 192 nm, an $F_2$ laser for 157 nm, an $Ar_2$ laser for 126 nm or a $Ne_2$ laser for 109 nm, and a beam-shaping optical system which produces a parallel light bundle. The rays of the light bundle have a linear polarization distribution where the oscillation planes of the electrical field vectors of the individual light rays are oriented in a uniform direction. The principal configuration of the illumination system 839 is described in DE 195 20 563 A1 (U.S. Pat. No. 6,285,433 B1). The parallel light bundle falls on the divergence-increasing optical element 837. As a divergence-increasing optical element, one could use for example a raster plate with an arrangement of diffractive or refractive raster elements. Each raster element generates a light bundle whose angle distribution is determined by the dimension and focal length of the raster element. The raster plate is located in or near the object plane of an objective 840 that follows downstream in the light path. The objective 840 is a zoom objective which generates a parallel light bundle with a variable diameter. A direction-changing mirror 841 directs the parallel light bundle to an optical unit 842 which contains an axicon (i.e., a rotationally symmetric prism arrangement) 843. The zoom objective 840 in cooperation with the axicon 843 generates different illumination profiles in the pupil plane 845, depending on the setting of the zoom and the position of the axicon elements. A polarization-modulating optical element 801, for example of the kind shown in FIG. 3, is arranged in the pupil plane 845. The polarization-modulating optical element 801 is followed in the light path by a compensation plate 847 which has a thickness profile designed to compensate the angle deviations which the polarization-modulating optical element causes in the light rays that pass through it. The optical unit 842 is followed by a reticle-masking system (REMA) 849. The REMA Objective 851 projects an image of the reticle-masking system 849 onto the structure-carrying mask (reticle) 853, whereby the illuminated area of the reticle 853 is delimited. The projection objective 855 projects the image of the structure-carrying mask 853 onto the light-sensitive substrate 859. The space between the last optical element 857 of the projection objective and the light-sensitive substrate 859 contains an immersion liquid 861 with a refractive index different from air.

An additional advantage of the present invention is that polarization-modulating optical elements or the optical system according to the present invention can be used for adjusting the polarization distribution and also for temperature compensation of the polarization distribution in a microlithography projection system as described in FIG. 8. Advanced microlithography projection systems require in some applications a predefined polarization distribution at the reticle 853 with an accuracy of about 5° or even better, in some cases even better than 1°.

Since the polarization distribution at the reticle is influenced by the various optical elements by e.g. tension-induced birefringence, or by undefined or uncontrolled changes of the temperature of individual optical elements, the polarization distribution can unpredictably or uncontrollably change over time. To correct such changes the temperature dependency of the specific rotation α of the polarization-modulating optical element can be used to control the magnitude of the polarization angles. The optical system according to an embodiment of the present invention preferably comprises a polarization control system for controlling the polarization distribution of the light beam which is propagating through the optical system. The polarization distribution of interest is at a predefined location in the optical system. The polarization control system comprises at least one heating or cooling device to modify the temperature and/or the temperature distribution of the polarization-modulating optical element to affect the polarization distribution of the light beam at the predefined location. Here the polarization-modulating optical element may have a varying or constant effective optical thickness.

In the case of a constant effective optical thickness the optical system comprises an optical axis or a preferred direction given by the direction of a light beam propagating through the optical system. The optical system additionally comprises a polarization-modulating optical element described by coordinates of a coordinate system, wherein one preferred coordinate of the coordinate system is parallel to the optical axis or parallel to said preferred direction. The polarization-modulating optical element comprises solid and/or liquid optically active material, wherein the effective optical thickness is constant as a function of at least one coordinate different from the preferred coordinate of the coordinate system. The optical system comprises further a polarization control system for controlling the polarization distribution of the light beam (propagating through the optical system) at a predefined location in the optical system, and the polarization control system comprises at least one heating or cooling device to modify the temperature and/or the temperature distribution of the polarization-modulating optical element to affect the polarization distribution of the light beam at the predefined location.

Figure 9:
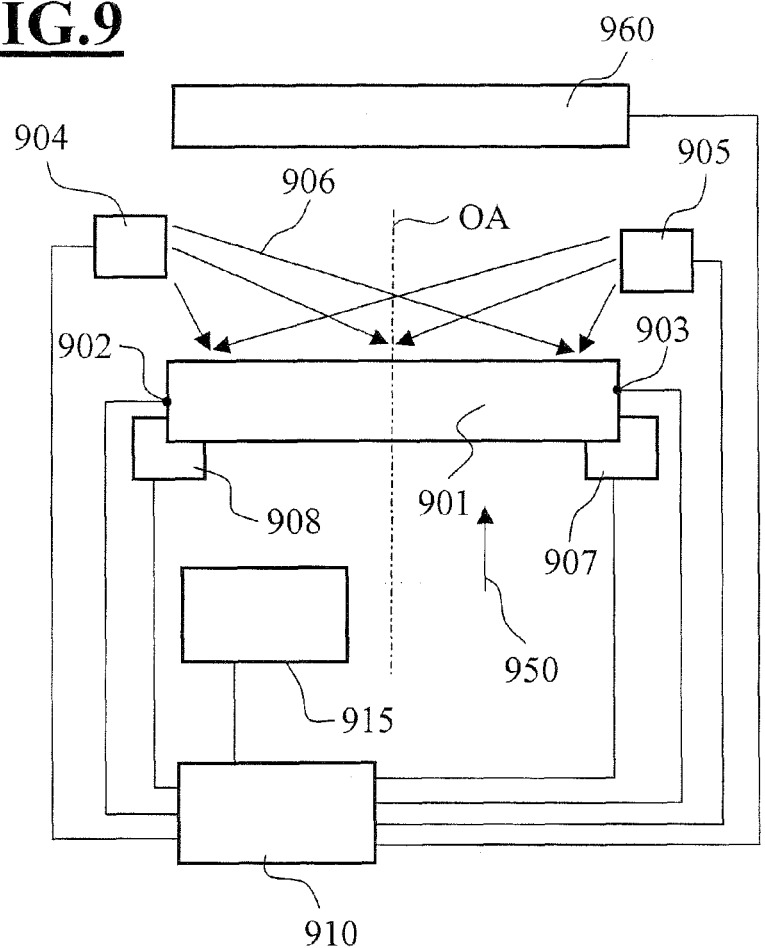
FIG. 9 schematically shows a parallel plane plate of optical active material used as a polarization-modulating element by adjusting its temperature and/or temperature profile.

As an example, if the polarization-modulating optical element (as used e.g. in the optical system according to the present invention) is made of synthetic (crystalline) quartz, comprising a parallel plate or formed as a parallel plate, a thickness of 10 mm of such a plate will result in a change of polarization of 23.6 mrad/° C. or 23.6 mrad/K, equivalent to 1.35°/K, due to the linear temperature coefficient γ of the specific rotation α with γ=2.36 mrad/(mm*K). These data correspond to a wavelength of 193 nm. In such an embodiment, which is schematically shown in FIG. 9, the optical axis OA of the parallel plate 901 is directed parallel or approximately parallel to the propagation of the light (indicated by reference numeral 950) in the optical system. Approximately parallel means that the angle between the optical axis OA of the parallel plate 901 and the direction of the light propagating through the optical system is smaller than 200 mrad, preferably smaller than 100 mrad or even smaller than 50 mrad. Controlling the temperature of the plate 901 will result in a controlled change of polarization. If for example the temperature of the plate will be controlled in a range of about 20° C. to 40° C., the polarization angles can be controllably changed in a range of about ±13.5° for such a plate 901 made of quartz. This high sensitivity allows a control of the polarization distribution by temperature control. In such a case even a plane plate with a thickness d of about 0.1 mm up to 20 mm will become a polarization-modulating optical element 901, able to controllably adjust a polarization distribution by controlling the temperature of the plate 901. Preferably for synthetic (crystalline) quartz the thickness of the plate 901 is n*278.5 μm (n is any integer) which results in a rotation of a polarization plane of at least 90° for n=1 and 180° for n=2 and in general n*90°, for a wavelength of 193 nm at about 21.6° C. For a 90° rotation of the polarization plane the synthetic quartz should be at least 278.5 μm thick and for 180° at least 557.1 μm, for 270° the thickness should be 835.5 μm and for a 360° rotation of the polarization the thickness is 1.114 mm. The manufacturing tolerances regarding thickness are about ±2 μm. Thus the manufacturing tolerance results in an inaccuracy of the angle of the polarization plane of the light which passes the plate of about ±0.64° at about 21.6° C. and 193 nm. To this inaccuracy an additional inaccuracy caused by temperature fluctuation of the plate (or polarization-modulating optical element) have to be considered, which is given by the linear temperature coefficient γ of the specific rotation α with is γ=2.36 mrad/(mm*K)=0.15°/(mm*K).

The temperature control of the plate 901 can be done by closed-loop or open-loop control, using a temperature sensing device with at least one temperature sensor 902, 903 for determining the temperature of the plate 901 (or providing a temperature sensor value which is representative or equal to the temperature and/or the temperature distribution of the polarization-modulating optical element), at least a heater 904, 905, preferably comprising an infrared heater, for heating the plate by infrared radiation 906, and a control circuit 910 for controlling the at least one heater 904, 905. As an example of a temperature sensing device a infrared sensitive CCD-element with a projection optics may be used, wherein the projection optics images at least a part of the plate 901 onto the CCD-element such that a temperature profile of the viewed part of the plate 901 can be determined by the analysis of the CCD-element signals. The control circuit 910 may comprise a computer system 915 or may be connected to the computer or control system 915 of the microlithography projection system 833 (see FIG. 8). In a preferred embodiment of the temperature controlled plate 901 the thickness is chosen such that a rotation of the polarization of n*90°, n is any integer number, is achieved at a temperature $T=(T_{max}-T_{min})/2+T_{min}$, whereas $T_{max}$ and $T_{min}$, are the maximum and minimum temperatures of the plate 901 (or in general the polarization-manipulating optical element). Preferably the heater or heating system (and also any cooling device like a Peltier element) is arranged such that it is not in the optical path of the microlithography projection system 833, or that it is not in the optical path of the light beam which is propagating through the optical system according to an embodiment of the present invention. Preferably the optical system with the polarization control system according to the present invention is used in a system with at least one additional optical element arranged between the polarization-modulating optical element and the predefined location in the optical system such that the light beam contacts the at least one additional optical element when propagating from the polarization-modulating optical element to the predefined location. The additional optical element preferably comprises a lens, a prism, a mirror, a refractive or a diffractive optical element or an optical element comprising linear birefringent material. Thus the optical system according to the present invention may form a part of a microlithography projection system 833.

In a further preferred embodiment the temperature of the polarization-manipulating optical element 901 (the plate as shown in FIG. 9) corresponds to a predefined temperature profile. As an example, such a temperature profile is achieved by using a plurality of infrared heaters 904, 905 to produce a radiation distribution across the optical element 901 which heats the optical element 901 in a controlled way with a control circuit as already described. In such an embodiment also a plurality of temperature sensors 902, 903 can be used for the control circuit 910. With this embodiment the polarization state in a field plane or pupil plane of the microlithography projection system 833 can be adjusted locally.

Alternatively or in addition the heater or heating elements 904, 905 may be replaced or supplemented by one or more Peltier-elements 907, 908. The Peltier-element or elements are preferably connected to the control circuit 910 such that a control by open and/or closed loop control is possible. The advantage of the Peltier-elements is that also a controlled cooling of the polarization-manipulating optical element 901 can be achieved. Heating and cooling the optical element 901 at the same time result in complex temperature distributions in the polarization-modulating optical element 901, which result in complex polarization distributions of the light 950 propagating e.g. through the microlithography projection system 833, after passing the element 901. Of course, other heating and cooling means than the ones mentioned above can be used to achieve a required temperature profile or a required temperature of the polarization-modulating optical element 901.

The application of the plane plate 901 as polarization-modulating optical element 801 in the illumination system of a microlithography projection apparatus 833 (see FIG. 8) is preferably in the pupil plane 845 and/or at positions between the light source unit 835 and the mentioned pupil plane 845. Applying the plane plate 901 at these locations has the advantage that the angle of incidence of the light which passes through the plate 901 and also passing through the microlithography projection apparatus is smaller than about 6° (100 mrad). At these small angles the influence of linear birefringence, caused by the plate 901, is very small such that the polarization of the light after passing the plate 901 is almost linear with negligible elliptical parts, if the light was linearly polarized before entering the plate 901.

In a further preferred embodiment of the invention the state of the polarization of the light passed through the polarization-modulating element 901 or the optical system according to the present invention is measured. For this the polarization control system comprises a polarization measuring device providing a polarization value representative for or equal to the polarization or the polarization distribution of the light beam at the predetermined location in the optical system. Further, the control circuit controls the at least one heating or cooling device dependent on the temperature sensor value and/or the polarization value by open or closed loop control. The measured state of polarization is compared with a required state and in the case that the measured state deviates more than a tolerable value, the temperature and/or the temperature distribution of the polarizing-modulating element like the plane plate 901 is changed such that the difference between the measured and the required state of polarization becomes smaller, and if possible such small that the difference is within a tolerable value. In FIG. 9 the measurement of the state of polarization is measured in-situ or with a separate special measurement, depending on the polarization measuring device 960. The polarization measuring device may be connected with the control circuit 910, such that depending on the measured polarization state values the heating means 904, 905 and/or 907, 908 are controlled heated and/or cooled such that the measured and the required state of polarization becomes smaller. The control can be done in open or closed loop modus.

The plane plate 901 used as polarization-modulating optical element or being a part of such element is especially appropriate to correct orientations of polarization states of the passed light bundles.

Figure 10:
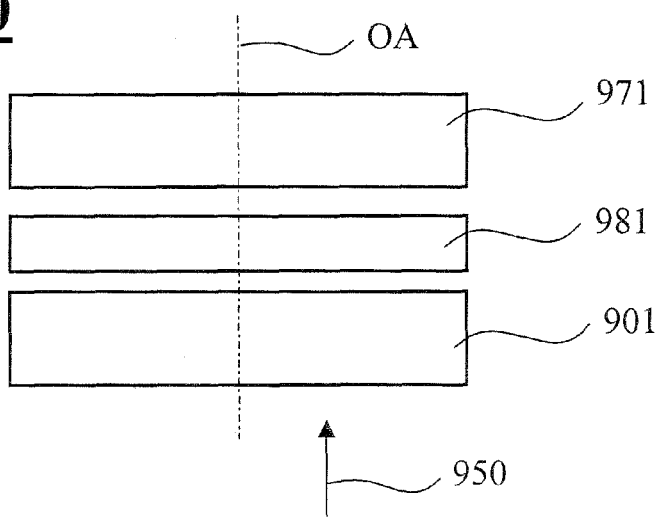
FIG. 10 shows a combination of a parallel plate of optical active material with a plate made of birefringent material.

In a further embodiment of the present invention the plane plate 901 (comprising or consisting of optically active material), used as a polarization-modulating optical element, is combined with a plate 971 (see FIG. 10), comprising or consisting of linear birefringent material. With this embodiment of the invention the orientation and the phase of the passing light bundle 950 can be subjected such that e.g. a plane polarized light bundle becomes elliptically polarized after passing both plane plates 901 and 971, or vice versa. In this embodiment at least one plate 901 or 971 is controlled regarding its temperature and/or temperature distribution as described in connection with FIG. 9. Further, the sequence of the plates 901 and 971 may be changed such that the passing light bundles are first passing through the plate 971, comprising or consisting of linear birefringent material, and than through the plate 901, comprising or consisting of optical active material, or vice versa. Preferably both plates are consecutively arranged along the optical axis OA of the system. Also, more than one plate comprising or consisting of linear birefringent material, and/or more than one plate comprising or consisting of optical active material may be used to manipulate the state of polarization of the passing light bundles. Further, a plane plate 971, or 901 may be exchanged by a liquid cell or cuvette containing optically active material. Also the plane plates 971, comprising or consisting of linear birefringent material, and plate 901, comprising or consisting of optical active material, can be arranged such that at least one other optical element 981 is placed between these plane plates. This element 981 can be for example a lens, a diffractive or refractive optical element, a mirror or an additional plane plate.

In an additional embodiment of the present invention a polarization-modulating element or in general a polarizing optical element is temperature compensated to reduce any inaccuracy of the polarization distribution generated by the polarization-modulating element due to temperature fluctuations of said element, which for synthetic quartz material is given by the linear temperature coefficient $\gamma$ of the specific rotation $\alpha$ for quartz (which is as already mentioned above $\gamma=2.36$ mrad/(mm*K)=0.15°/(mm*K)). The temperature compensation makes use of the realization that for synthetic quartz there exist one quartz material with a clockwise and one quartz material with a counterclockwise optical activity (R-quartz and L-quartz). Both, the clockwise and the counterclockwise optical activities are almost equal in magnitude regarding the respective specific rotations $\alpha$. The difference of the specific rotations is less than 0.3%. Whether the synthetic quartz has clockwise (R-quartz) or counterclockwise (L-quartz) optical activity dependents on the seed-crystal which is used in the manufacturing process of the synthetic quartz.

Figure 11:
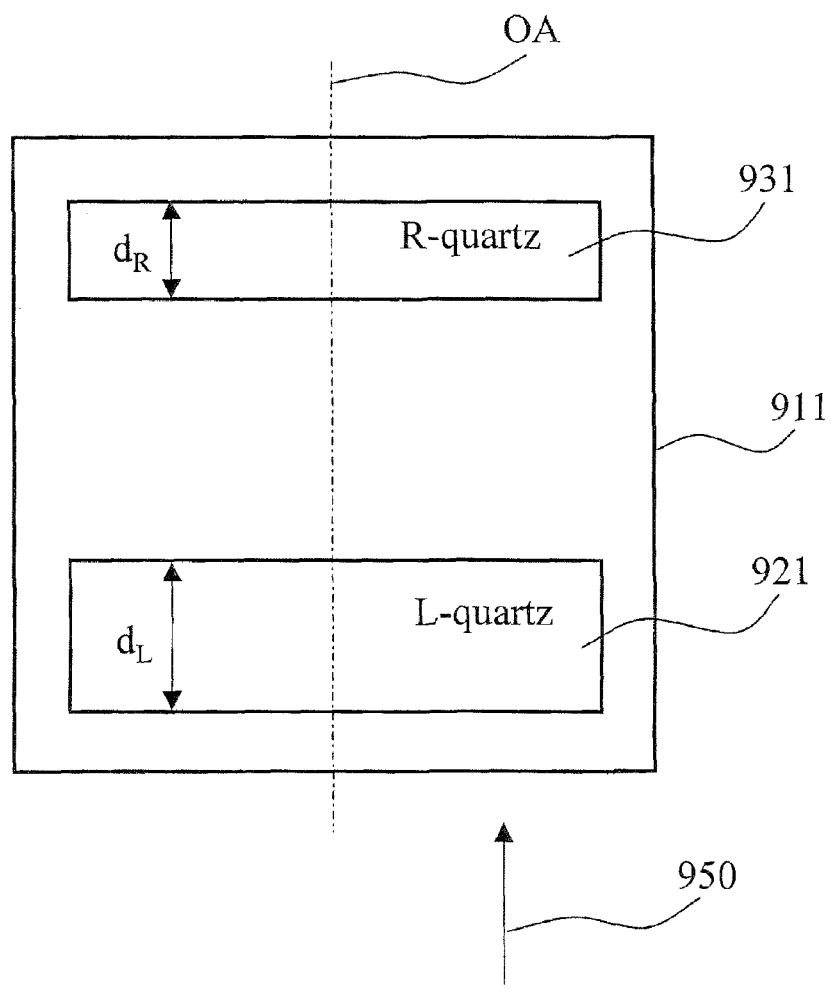
FIG. 11 shows schematically a temperature compensated polarization-modulating optical element for the application in an optical system.

R- and L-quartz can be combined for producing a thermal or temperature compensated polarization-modulating optical element 911 as shown in FIG. 11. Regarding the change of the state of polarization such a temperature compensated polarization-modulating optical element 911 is equivalent to a plane plate of synthetic quartz of thickness d. For example, two plane plates 921 and 931 are arranged behind each other in the direction 950 of the light which is propagating through the optical system which comprises the temperature compensated polarization-modulating optical element 911. The arrangement of the plates is such that one plate 931 is made of R-quartz with thickness $d_R$, and the other 921 is made of L-quartz with thickness $d_L$, and $|d_R-d_L|=d$. If the smaller thickness of $d_R$ and $d_L$ ($\min(d_R, d_L)$) is larger than d or $\min(d_R, d_L)>d$, which in most cases is a requirement due to mechanical stability of the optical element, then the temperature dependence of the polarization state becomes partly compensated, meaning that the temperature dependence of the system of R-quartz and L-quartz plates is smaller than $\gamma=2.36$ mrad/(mm*K)*d=0.15°/(mm*K)*d, wherein d is the absolute value of the difference of the thicknesses of the two plates $d=|d_R-d_L|$. The following example demonstrates this effect. A R-quartz plate 931 with a thickness of e.g. $d_R=557.1$ µm (resulting in a 180° clockwise change of the exiting polarization plane compared to the incident polarization plane) is combined with a L-quartz plate 921 with a thickness of $d_L=557.1$ µm+287.5 µm (resulting in a 270° counterclockwise change of the exiting polarization plane compared to the incident polarization). This result in a 90° counterclockwise change of the polarization plane after the light pass both plane plates 921, 931, corresponding to a 270° clockwise change of the polarization plane if just a R-quartz plate would be used. In this case the temperature compensation is not fully achieved, but it is reduced to value of about 0.04°/K if both plates are used, compared to 0.13°/K if just a R-quartz plate of $d_R=557.1$ µm+287.5 µm would be used. This is a significant reduction of temperature dependency, since even if the temperature will change by 10° C. the change of the polarization plane is still smaller than 1°.

In general any structured polarization-modulating optical element made of R- or L-quartz, like e.g. the elements as described in connection with FIGS. 3 and 4*a* can be combined with a plane plate of the respective other quartz type (L- or R-quartz) such that the combined system 911 will have a reduced temperature dependence regarding the change of the polarization. Instead of the plane plate also a structured optical element made of the respective other quartz type may be used such that in FIG. 11 the shown plates 921 and 931 can be structured polarization-modulating optical elements as mentioned in this specification, having specific rotations of opposite signs, changing the state of polarization clockwise and counterclockwise.

To generalize the above example of a temperature compensated polarization-modulating optical element 911, the present invention also relates to an optical system comprising an optical axis OA or a preferred direction 950 given by the direction of a light beam propagating through the optical system. The optical system comprising a temperature compensated polarization-modulating optical element 911 described by coordinates of a coordinate system, wherein one preferred coordinate of the coordinate system is parallel to the optical axis OA or parallel to said preferred direction 950. The temperature compensated polarization-modulating optical element 911 comprises a first 921 and a second 931 polarization-modulating optical element. The first and/or the second polarization-modulating optical element comprising solid and/or liquid optically active material and a profile of effective optical thickness, wherein the effective optical thickness varies at least as a function of one coordinate different from the preferred coordinate of the coordinate system. In addition or alternative the first 921 and/or the second 931 polarization-modulating optical element comprises solid and/or liquid optically active material, wherein the effective optical thickness is constant as a function of at least one coordinate different from the preferred coordinate of the coordinate system. As an additional feature, the first and the second polarization-modulating optical elements 921, 931 comprise optically active materials with specific rotations of opposite signs, or the first polarization-modulating optical element comprises optically active material with a specific rotation of opposite sign compared to the optically active material of the second polarization-modulating optical element. In the case of plane plates, preferably the absolute value of the difference of the first and the second thickness of the first and second plate is smaller than the thickness of the smaller plate.

In an additional embodiment of the present invention a polarization-modulating element comprises an optically active and/or optically inactive material component subjected to a magnetic field such that there is a field component of the magnetic field along the direction of the propagation of the light beam through the polarization-modulating element. The optical active material component may be constructed as described above. However, also optical inactive materials can be used, having the same or similar structures as described in connection with the optical active materials. The application of a magnetic field will also change the polarization state of the light passing through the optical active and/or optical inactive material due to the Faraday-effect, and the polarization state can be controlled by the magnetic field.

In the following, further embodiments of the present invention related to the above-described aspect of temperature-compensation are described with reference to FIG. 12 to 16.

Figure 12:
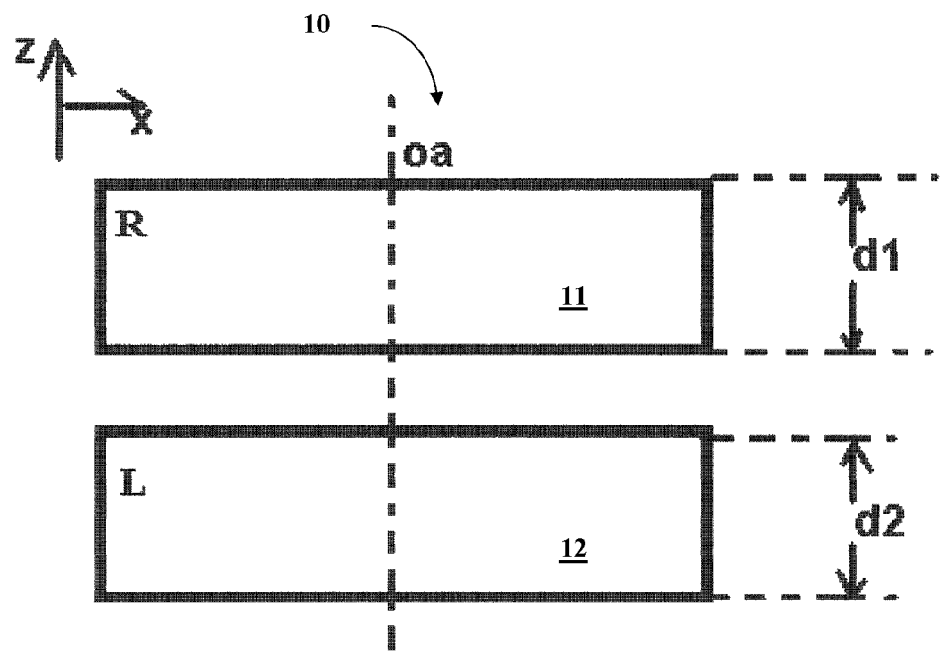
FIG. 12-13 show schematically temperature compensated optical elements according to further embodiments of the present invention.

FIG. 12 also shows an arrangement 10 of two plane plates 11 and 12 being arranged behind each other along the optical axis oa of an optical system and made of optically active material (crystalline quartz). More specifically, plate 11 is made from optically active quartz with a specific rotation of opposite sign compared to the optically active quartz of the second plate 12. In the illustrated example, the first plate 11 is made of right-handed quartz, whereas the second plate 12 is made of left-handed quartz (which can of course be vice-versa, too). In contrast to FIG. 11, the thicknesses of plates 11 and 12 are identical and may e.g. be (in a non-limiting example) 0.5 mm. In order to realize the principle of the embodiment shown in FIG. 12, the thicknesses d1, d2 of the plates 11 and 12 just have to be substantially identical, e.g. by meeting the criterion $|d1-d2| \leqq 0.01*(d1+d2)$. As a consequence, if the first, right-handed plate 11 rotates the orientation of the polarization of linear polarized light by an excess of e.g. 5.9 mrad (i.e. by 5.9 mrad too much) as a result of a temperature shift of $\Delta 5K$, this effect is compensated since the second left-handed plate 12 rotates the orientation of the polarization of linear polarized light by a too-little amount of 5.9 mrad.

Figure 13:
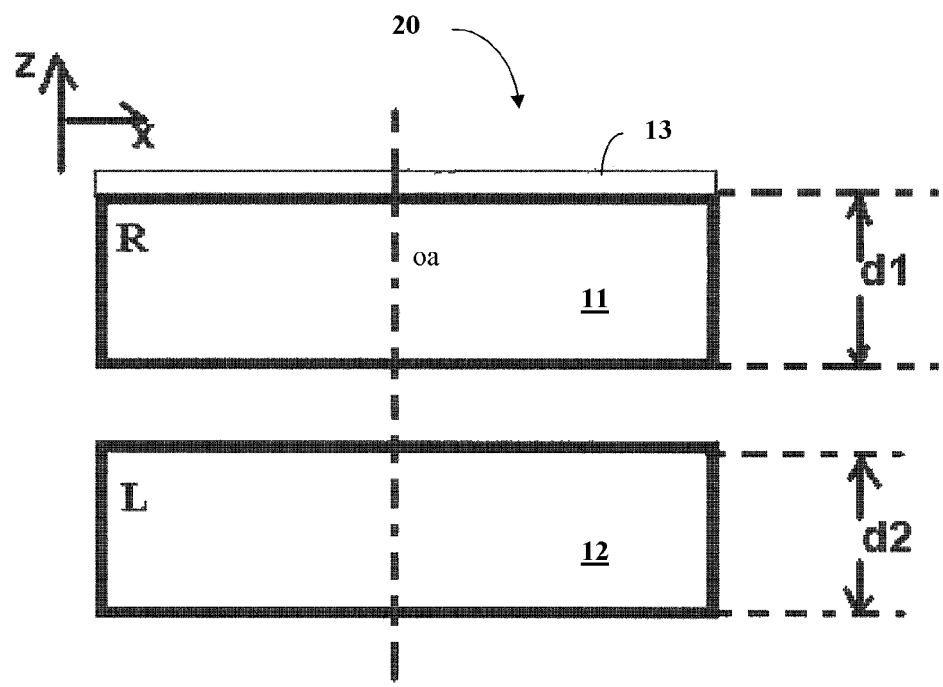

As a consequence, the temperature effects in both plates 11, 12 compensate each other, so that—due to the substantially identical thicknesses of the plates 11, 12—the polarization state of light passing both plates 11, 12 remains unchanged. The arrangement shown in FIG. 12 may in particularly be used to provide a diffractive optical element, as it is just schematically illustrated in FIG. 13. Hereto, a diffractive structure 13 can be applied e.g. on the first plate 11. Since such a structure 13 typically has a depth of the etched structures in the range of 200-400 nm, which is typically more than three orders of magnitude lower than the typical thicknesses of the first and second plate, respectively, the contribution of the structure 13 to a change of the circular birefringence can be neglected. With the arrangements shown in FIGS. 12 and 13, a detrimental effect of temperature variations on the polarization state of light passing therethrough can be avoided even with relatively large thicknesses (e.g. of several mm) of the plates 11, 12, which qualifies the arrangement of the plates for use as a support e.g. of a diffractive optical element as shown in FIG. 13. Furthermore, due to the use of crystalline material instead of e.g. amorphous glass or fused silica, the undesired effect of thermal compaction leading to local variations of the density and non-deterministic birefringence properties, which would inadvertently modify or destroy the polarization distribution after the optical arrangement, is avoided or significantly reduced even in the presence of electromagnetic radiation of relatively high energies.

Figure 14A:
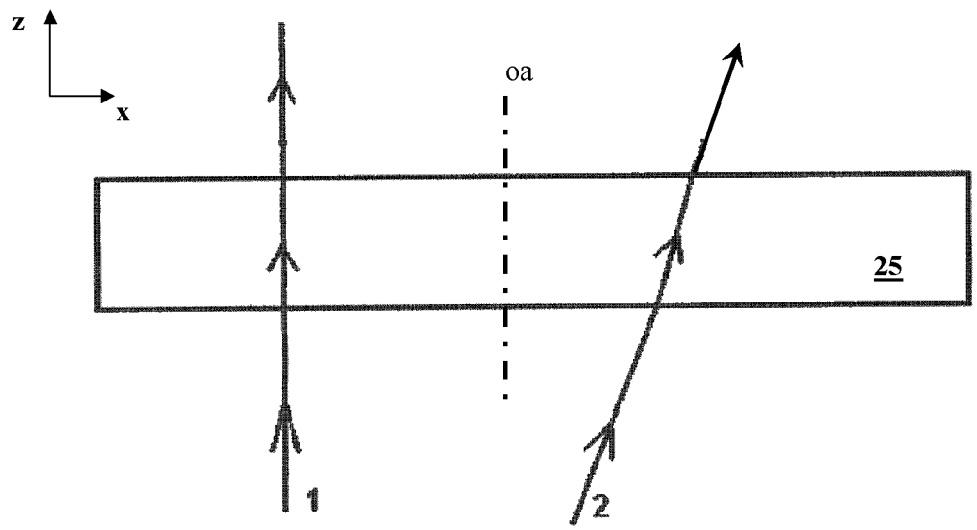
FIG. 14a-b are schematic illustrations to demonstrate the effect of a temperature compensated optical element according to a further embodiment of the present invention.
Figure 14B:
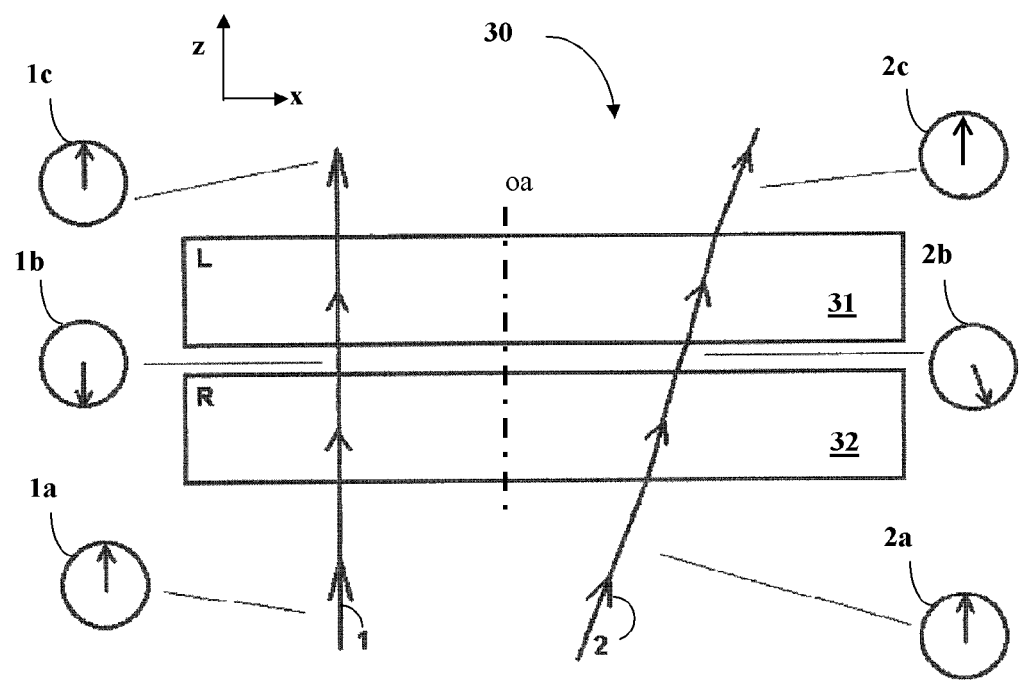

With reference to FIGS. 14a and 14b, further arrangements are described which enable, in addition to the above described temperature compensation, also the use of the respective embodiment in a region of relatively large aperture angles without occurrence of a significant undesired modification of the polarization distribution after the respective arrangement.

FIG. 14a shows a single plane plate 25 being made of right-handed (or alternatively left-handed) optically active quartz such that the optical crystal axis is aligned with the direction of optical system axis oa (z-axis). Furthermore, the thickness of plate 25 is selected such that the orientation of the direction of linear polarized light which perpendicularly enters the plate 25 is rotated by an angle of 180° or an integer multiple thereof. If synthetic, optically active quartz is used which has at a wavelength of 193 nm a specific rotation of $\alpha=323.1°/mm$ at a temperature of 21.6° C., this condition corresponds for a single rotation of 180° to a thickness of $\approx 557$ µm.

As to the light beam "1" which passes plate 305 along the optical crystal axis, only circular birefringence and no linear birefringence occurs. As to light beam "2" which passes plate 25 not parallel to the optical crystal axis, the additional effect of linear birefringence occurs, with said linear birefringence reaching its maximum value if the light beam is perpendicular to the optical crystal axis, whereas the effect of circular birefringence decreases for increasing angular between the light beam and the optical crystal axis. Since the orientation of polarization is rotated between the light entrance surface and the light exit surface of plate 25 by $\approx 180°$ (which is approximately true also for beam "2" in spite of the decreasing circular birefringence if also considering the increased travelling path), said orientation of polarization is rotated by $\approx 90°$ after beam "2" has passed half of the thickness of plate 25. As a consequence, a polarity inversion (i.e. a reversal of the signs) occurs for the linear birefringence after beam "2" has passed half of the thickness of plate 25, so that the phase shifts collected due to linear birefringence while passing the first half of plate 25 are corrected back by the phase shifts collected due to linear birefringence while passing the second half of plate 25, which means that the effect of linear birefringence is almost nearly compensated for beam "2" after having passed the whole plate 25.

FIG. 14b shows an arrangement similar to FIG. 12 in so far as an arrangement 30 comprises two plane plates 31 and 32 being arranged behind each other along the optical axis oa of an optical system and made of optically active material (crystalline quartz). Plate 31 is made from left-handed optically active quartz, i.e. with a specific rotation of opposite sign compared to the right-handed optically active quartz of the second plate 32. The thicknesses d1 and d2 of plates 31 and 32 are at least substantially identical, e.g. by meeting the criterion $|d1-d2| \leqq 0.01*(d1+d2)$. Furthermore, the thicknesses d1 and d2 of plates 31 and 32 are selected such that the orientation of the direction of linear polarized light which perpendicularly enters plate 32, or plate 31 respectively, is rotated, in each of the plates 31 and 32, by an angle of 180° or an integer multiple thereof. If synthetic, optically active quartz is used which has at a wavelength of 193 nm a specific rotation of $\alpha=323.1°/mm$ at a temperature of 21.6° C., this condition corresponds for a single rotation of 180° in each plate 31, 32 to a thickness of $d1=d2 \approx 557$ µm. More generally, the thicknesses d1 and d2 of plates 31 and 32 are selected such that the orientation of the direction of linear polarized light which perpendicularly enters plate 32, or plate 31 respectively, is rotated, in each of the plates 31 and 32, for the operating wavelength $\lambda$ (of e.g. 193 nm) by an angular in the region of $160°+N*180°$ to $200°+N*180°$, more preferably in the region of $170°+N*180°$ to $190°+N*180°$, still more preferably by an angular of $N*180°$ (with N being an integer greater or equal zero). This arrangement also results in a relatively weak sensitivity of the polarization state on the angle of incidence of the beam as explained in the following.

As to the light beam "1" which passes plates 32 and 31 along the optical crystal axis, only circular birefringence and no linear birefringence occurs. The orientation of polarization of beam "1" is rotated clockwise in plate 32 by 180° and is then rotated counterclockwise in plate 31 by 180°, so that the orientation of polarization beam 1 is effectively not rotated when passing the whole arrangement of plates 32 and 31.

Light beam "2" enters plate 32 under an angle of incidence larger than zero and therefore experiences also the effect of linear birefringence, whereas the effect of circular birefringence decreases with increasing angle of incidence. As a consequence, the orientation of polarization for light beam 2 is rotated clockwise in plate 32 by less than 180° (see diagram 2b on the right side of FIG. 14b), and the light beam "2" will be weakly elliptically polarized after exit of plate 32. However, due to the above selection of thickness of plate 32, the effect of linear birefringence is almost compensated so that said elliptical portion is relatively weak. Since the first plate 31 is passed with opposite rotational direction and the same travelling distance as the second plate 32, the orientation of polarization of light beam "2" is rotated back by substantially the same angle when passing the second plate 32 (see diagram 2c on the right side of FIG. 14b). Accordingly, the orientation of polarization of light beam "2" upon exit of plate 31 is substantially identical to the orientation of polarization of light beam "2" upon entrance in plate 32 (see diagrams 2a and 2c on the right side of FIG. 14b). Furthermore, since the decrease of the optical activity with increasing angle of incidence is substantially equal in both plates 31 and 32, said effect is not disturbing the maintenance of the polarization state.

As described above with reference to FIG. 14a, the relatively weak sensitivity of the polarization state on the angle of incidence of the beam is also achieved for only one plane plate 25 whose thickness is selected such that the orientation of the direction of linear polarized light which perpendicularly enters the plate 25 is rotated by an angle of 180° or an integer multiple thereof. However, due to the combination of two plates 31 and 32 according to FIG. 14b, i.e. with specific rotations of opposite sign compared to each other, a detrimental effect of temperature variations on the polarization state of light passing through the arrangement can be avoided even with relatively large thicknesses (e.g. of several mm) of the plates 31, 32, as already described above. As to this effect of temperature compensation which is also achieved for the embodiment of FIG. 14b, reference can be made to the embodiments described above with respect to FIGS. 12 and 13.

Figure 15:
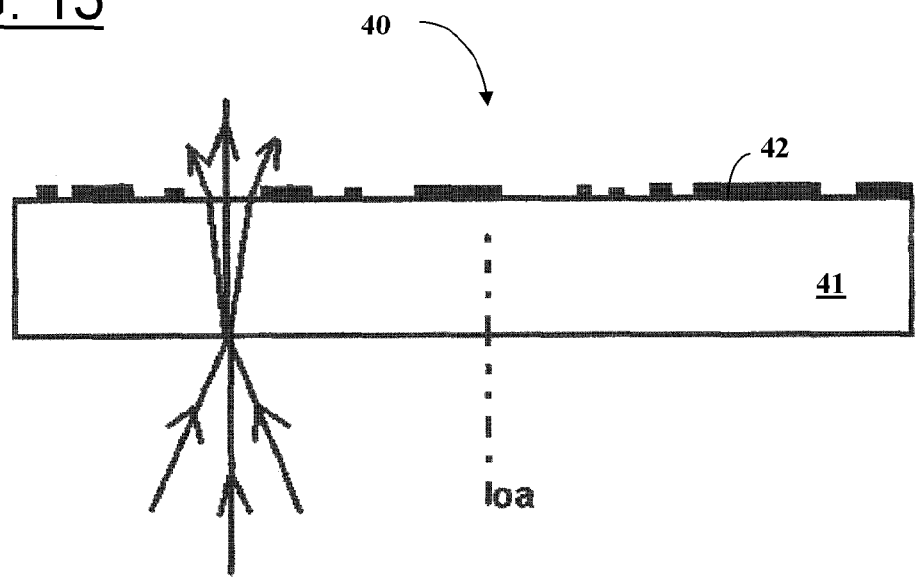
FIG. 15-16 are schematic illustrations of a temperature compensated grey filter (FIG. 15) and a temperature compensated diffractive optical element (FIG. 16) according to further embodiments of the present invention.

In the embodiment of FIG. 15, two plates as described above with respect to FIG. 12 (i.e. of right-handed or left-handed quartz, respectively, are combined (e.g. by optical wringing) to form a support 41 of a grey filter 40, said grey filter 40 also comprising an absorbing structure 42 of material having a reduced transmittance at the operating wavelength of e.g. 193 nm. This structure can e.g. be formed of vapour-deposited chrome of variable thickness (e.g. in the region of 200-400 nm) and density.

Figure 16:
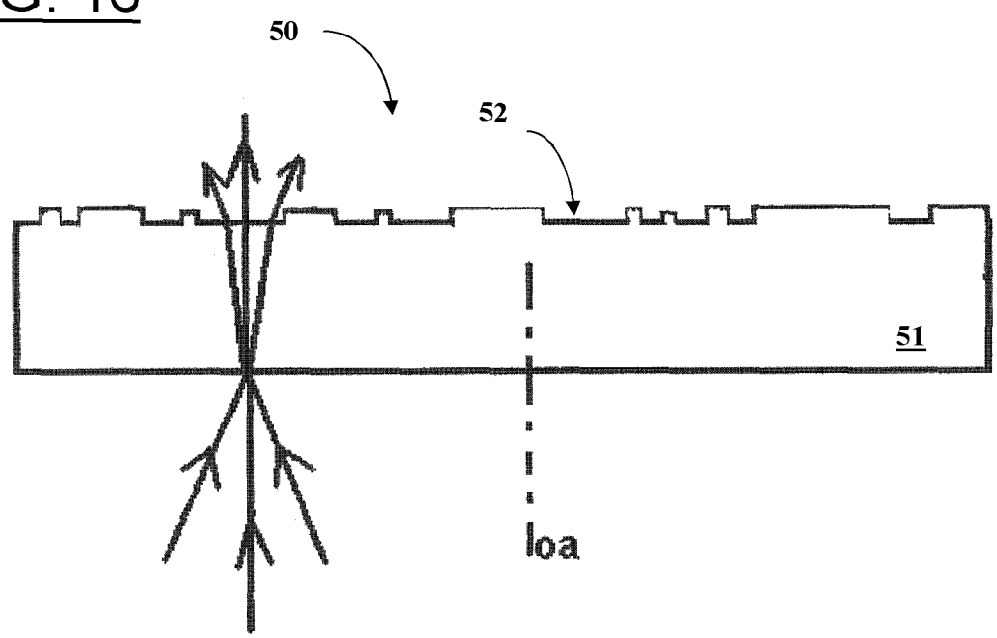

In the embodiment of FIG. 16, a diffractive optical element 50 comprises a support 51, which may be formed identical as the support 40 of FIG. 15 but comprises a deepened structure 52. The support 51 can be made according to anyone of the embodiments described with respect to FIG. 12-14, i.e. by combining (preferably by wringing) two plane plates of identical thickness, wherein said thicknesses may be arbitrary but particularly may be selected such that a rotation of the orientation of polarization of linear polarized light that perpendicularly enters the plates is rotated by an angle of substantially 180° in each of the plates. Preferably, the maximum depth of the structure 52 is not more than 0.1% of the thickness of the support 51 (e.g. the maximum depth of the structure 52 is not more 1 µm if the thickness of the support 51 is 1 mm), so that the compensation effect achieved by said 180°-rotation is achieved to a large extend. According to a further embodiment, the optical element illustrated in FIG. 16 can also be used as a diffusion panel.

As a consequence of the weak sensitivity of the grey filter 40 or the diffractive optical element 50, said micro-optical elements are suitable to be used at a position in an illumination system where relatively large energy densities occur, since at such positions the avoidance of the above-discussed compaction effects and the compensation of the effects of temperature variations are particularly relevant. As an example, an optical arrangement or an optical element according to anyone of the embodiments described with reference to FIG. 12, 13, 14b and 15 can be arranged at a position in an illumination system where the energy density of the illumination light is more than 130%, more particularly at least 200%, and still more particularly at least 300% of the energy density in the reticle plane of the illumination system. Further preferred positions of such an optical arrangement or element are in the region of relatively large numerical aperture, e.g. at or near the position of a filed defining element in the pupil plane (see reference number 845 in FIG. 8). Preferred positions are further characterized in that the maximum aperture angle of a light beam relative to the optical axis at the respective position is not more than 350 mrad or the numerical aperture is not more than 0.4. A further embodiment is a diffusion panel arranged downstream of the pupil plane (see reference number 845 in FIG. 8). As a consequence of the relatively weak sensitivity of the polarization state on the angle of incidence of the beam for the embodiment of FIG. 14b, the maximum aperture angle of a light beam relative to the optical axis at the respective position of such an optical arrangement or element can be at least 200 mrad, more particularly more than 300 mrad. Such an optical arrangement or element is also advantageously used in an illumination system in combination with certain illumination settings providing relatively large aperture angles (such as annular illumination, dipole or quadrupole illumination).

Going back to the embodiments of the polarization-modulating optical element discussed before and having a variable thickness profile measured in the direction of the optical crystal axis, further advantageous embodiments are described in the following with reference to FIG. 17a-d and 18a-c.

As already mentioned above, the refraction occurring in particular at sloped surfaces of the polarization-modulating element can cause a deviation in the direction of an originally axis-parallel light ray after it has passed through the polarization-modulating element. In order to compensate for this type of deviation, it is advantageous to arrange a compensation plate in the light path of an optical system, with a thickness profile of the compensation plate designed so that it substantially compensates an angular deviation of the transmitted radiation that is caused by the polarization-modulating optical element. In an advantageous embodiment of the present invention which is explained in more detail in the following, said compensation plate is also made of an optically active material.

Figure 17A:
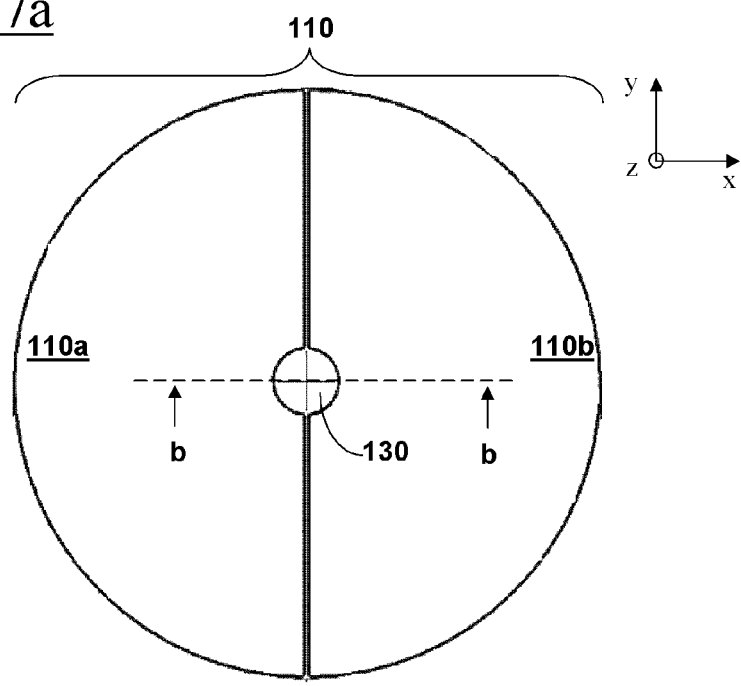
FIGS. 17a-d show different views on a combination of a polarization-modulating optical element with a compensation plate in a preferred embodiment of the present invention.
Figure 17B:
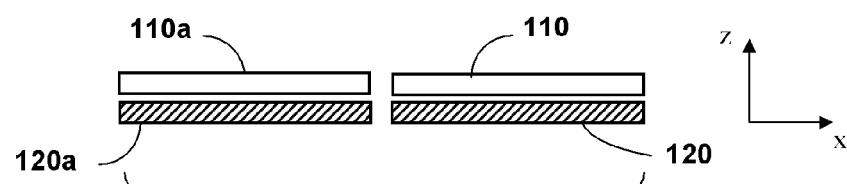
Figure 17C:
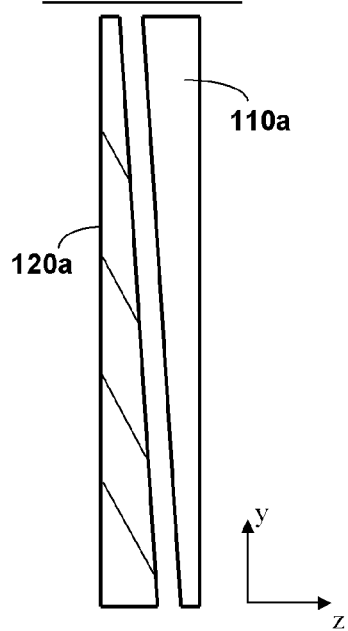
Figure 17D:
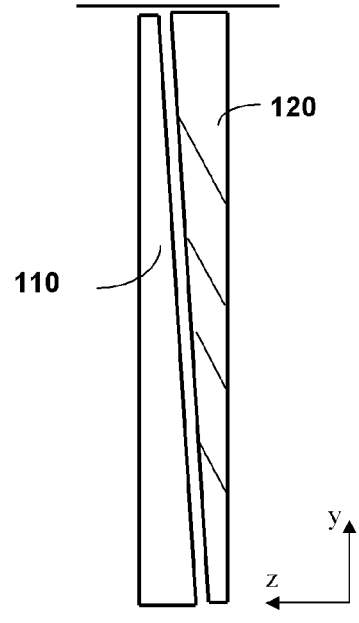

FIGS. 17a-d shows different views on a combination of a polarization-modulating optical element with a compensation plate according to preferred embodiments of the present invention, while FIGS. 18a-c show thickness profiles as a function of the azimuth angle for various embodiments with different combinations of a polarization-modulating optical element with a compensation plate. The view shown in FIG. 17b is a cross-section along the dashed line in direction of the arrows "b", whereas the views shown in FIGS. 17c and 17d are side views on the arrangement in FIG. 17a from the left (FIG. 17c) or the right (FIG. 17d), respectively.

The optical arrangement according to FIG. 17a-d comprises a polarization-modulating optical element 110 composed of parts 110a and 110b, and a compensation plate 120 composed of parts 120a and 120b. Of course, the composition of the polarization-modulating optical element 110 and the compensation plate 120 is just for technological reasons and may principally also be omitted or replaced by a composition of more than 2 parts. The optical element 110 further has an optional central bore 130 coaxial with the element axis.

The shape of the polarization-modulating optical element 110 shown in FIG. 12a-d corresponds to that of the polarization-modulating optical element 301 shown in FIG. 3, but is illustrated in FIG. 17a-d to schematically explain the relative arrangement of a compensation plate 120 in relation to the polarization-modulating optical element 110. Accordingly, the polarization-modulating optical element 110 shown in FIG. 17a-d has a planar base surface and an opposite inclined surface designed to achieve a thickness profile as already explained above with reference to FIG. 4d. In the special configuration illustrated in FIG. 17, the thickness of the polarization-modulating optical element 110 is constant along a radius R that is perpendicular to the element axis, which again is parallel to the z-axis in the coordinate system also illustrated in FIG. 17a-d. Thus, like in FIG. 3, the thickness profile in the illustrated embodiment of FIG. 17, which is shown in FIG. 18b, only depends on the azimuth angle θ and is given by d=d(θ). In another embodiment of the polarization-optical element the thickness of the polarization-modulating optical element 110' may vary along the radius R such that the thickness profile is d=d(R,θ).

In the exemplarily embodiment, the polarization-modulating optical element 110 may be made of R-quartz, with the optical axis of the optically active crystal running parallel to the element axis. "R-quartz" means that the optically active quartz is turning the direction of polarization clockwise if seen through the optically active quartz towards the light source.

Furthermore, although the compensation plate 120 is shown, in FIG. 17, in front of the polarization-modulating optical element with respect to the direction of light propagation (which is running into the z-direction), it can of course also be arranged behind the polarization-modulating optical element.

As can also be seen in FIG. 17, the compensation plate 120 being arranged in the light path of the optical system has a thickness profile being a complement to the thickness profile of the polarization-modulating optical element 110 in such a sense that the compensation plate 120 and the polarization-modulating optical element 110 effectively add up to a planparallel structure. FIG. 18b shows, for the optical arrangement of FIGS. 17a-d, the thickness profile of both the polarization-optical element 110 and the compensation plate 120. In FIG. 18b, the thickness profiles of the parts 110a and 110b of the polarization-optical element 110 being illustrated with solid lines are designated as C1 and C2, while the thickness profiles of the parts 120a and 120b of the compensation plate 120 being illustrated with dashed lines are designated as D1 and D2.

In the exemplarily embodiment with the polarization-modulating optical element 110 being made of R-quartz, the compensation plate 120 is preferably made of L-quartz. "L-quartz" means that the optically active quartz is turning the direction of polarization counterclockwise if seen through the optically active quartz towards the light source. Of course the polarization-modulating optical element 110 can also be, vice versa, made of L-quartz, with the compensation plate 120 being made of R-quartz. More generally, the compensation plate 120 comprises an optically active material with a specific rotation of opposite sign compared to said first optically active material.

Figure 18:
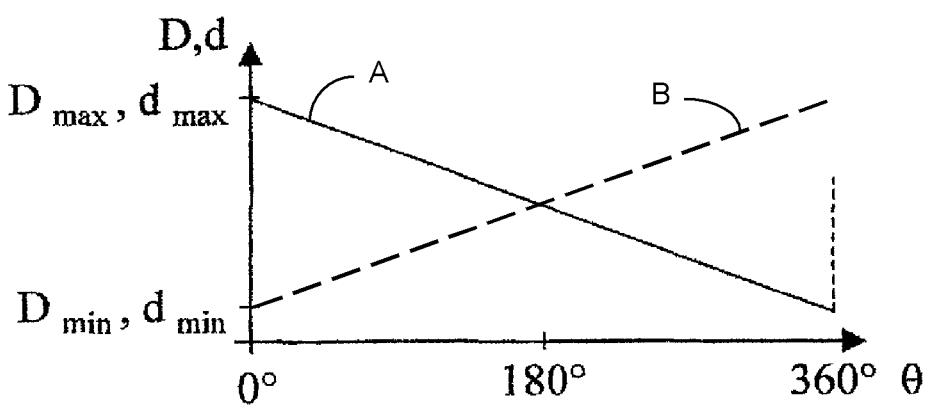
FIGS. 18a-c show thickness profiles as a function of the azimuth angle for different combinations of a polarization-modulating optical element with a compensation plate.
Figure 18:
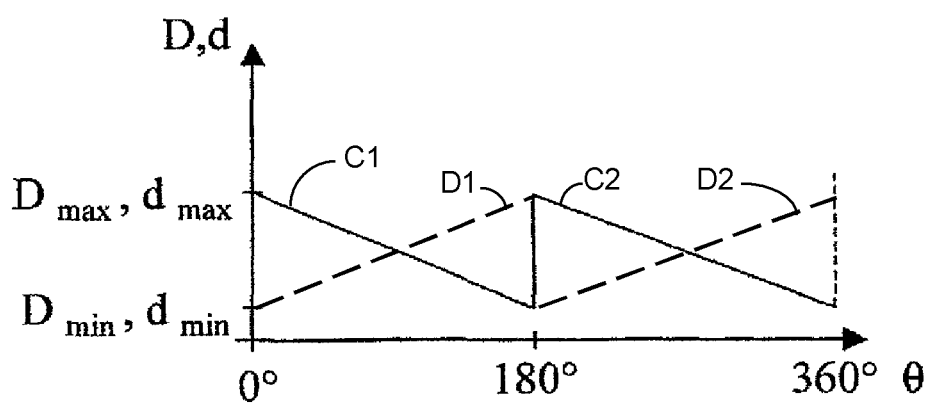
Figure 18:
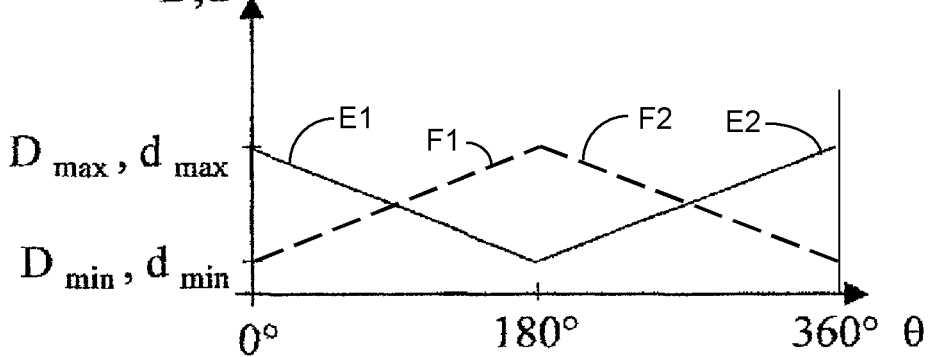

Furthermore, as already discussed before, the invention is not limited to the use of quartz or generally to the use of crystalline materials, so that both the polarization-modulating optical element and the compensation plate may also be replaced by one or more cuvettes of appropriate shape which are comprising an optically active liquid. In further more generalized embodiments, as has been already described above with reference to FIGS. 3 and 4, the thickness profiles discussed with reference to FIGS. 17 and 18 are not representing the geometrical thicknesses of the polarization-optical element or the compensation plate, respectively, but the profile represents an optical effective thickness D as defined above.

To evaluate the effect of this thickness profile, it has to be considered that since the polarization-optical element 110 and the compensation plate 120 are turning the direction of polarization of linear polarized light into opposite directions, the relevant factor for the net effect on each light ray traversing the arrangement the polarization-optical element 110 and the compensation plate 120 parallel to the optical axis of each of these elements is the difference of the thicknesses d or of optically effective thicknesses D being passed in the L-quartz or the R-quartz, respectively. Since this difference is just zero at the two crossing points of the solid lines C1, C2 with the dashed lines D1, D2, which occur for an azimuth angle of θ=90° as well as for an azimuth angle of θ=270°, a linearly polarized light ray passing the arrangement under an azimuth angle of θ=90° or θ=270° will leave the arrangement with the same orientation of polarization. This means that for a generation of a tangential polarization distribution as it has been explained above with reference to FIG. 5, the azimuth angles of θ=90° or θ=270° represent the "new" reference angles where the orientations of polarization are left unchanged with respect to the polarization distribution of the light entering the arrangement. As follows from the above, the arrangement of FIG. 17 of the polarization-optical element 110 and the compensation plate 120 being made of optically active materials with a specific rotation of opposite sign has to be placed in a position being rotated by 90° if compared to the position taken by the arrangement of FIG. 3.

For thicknesses 90°<θ<180°, the traveled distance in the R-quartz of the polarization-optical element is larger than the traveled distance in the L-quartz of the compensation plate, leading to a clockwise net-rotation of the direction of polarization. For thicknesses 0°<θ<90°, the traveled distance in the L-quartz of the compensation plate is larger than the traveled distance in the R-quartz of the polarization-optical element, leading to a counter-clockwise net-rotation of the direction of polarization.

Since both the polarization-modulating optical element 110 and the compensation plate 120 are rotating the direction of polarization into opposite directions, the slopes in the respective thickness profiles of the compensation plate and the polarization-modulating element may be reduced for each of these elements, if compared to a situation where only the polarization-modulating optical element is made of optically active material. More specifically and with reference to FIG. 18b, a tangential polarization distribution can be achieved with half the slope of the lines C1 and C2 describing the inclined surface of the polarization-modulating element (or D1 and D2, respectively, describing the inclined surface of the compensation plate). Accordingly, the thickness of the polarization-optical element 110 in this embodiment is, like in the embodiment explained with reference to FIGS. 3 and 4d, a linear function of the azimuth angle θ, but with half the slope, the absolute value of which being |m|=180°/(2·α·π) over each of two ranges of 0<θ<180° and 180°<θ<360° (of course this slope is also valid for the compensation plate 120).

A modification of the arrangement of FIG. 17 which is comparable to the embodiment explained above with reference to FIG. 4c, but also comprises a compensation plate, is shown in FIG. 18a, giving an example of a continuously varying thickness profile. The thickness d or optical effective thickness D of the azimuthal section of the polarization-optical element (whose thickness profile is shown with solid line A) in this embodiment shows a linear decrease over the whole azimuth-angle range of 0≦θ≦360°. Again, the shape of the compensation plate (whose thickness profile is shown with dashed line B) is a complement in the sense that it shows a linear increase over the whole azimuth-angle range of 0≦θ≦360°. Further, as it is also the case for the embodiment explained with reference to FIG. 18b, a tangential polarization distribution can be achieved with half the slope of the line A describing the inclined surface of the polarization-modulating element (or B describing the inclined surface of the compensation plate) if compared to FIG. 4c. Accordingly, the absolute value of the slope of line A or B, respectively, is |m|=180°/(2·α·π) over an azimuth-angle range of 0≦θ≦360°. Alternatively the slope can also be |m|=180°/(2α·π·r) where r is the radius of a circle being centred at the element axis EA. In this case the slope depends on the distance of the element axis, e.g. if the polarization-modulating optical element has a given constant screw-slope (lead of a screw).

A further modification of the arrangement of FIG. 17 which is comparable to the embodiment explained above with reference to FIG. 4e, but also comprises a compensation plate is shown in FIG. 18c. The thickness d or optical effective thickness D of the azimuthal section of the polarization-optical element (whose thickness profile is shown with solid lines E1 and E2) is in this case a linear function of the azimuth angle θ with a first slope m for 0<θ<180° and with a second slope n for 180°<θ<360°. The slopes m and n are of equal absolute magnitude but have opposite signs. As explained above with reference to FIG. 4e, the concept of using opposite signs for the slope in the two azimuth angle ranges avoids the occurrence of discontinuities in the thickness profile. Again, the shape of the compensation plate (whose thickness profile is shown with dashed lines F1 and F2) is a complement in the sense that it also shows a linear function of the azimuth angle θ with a first slope for 0<θ<180° and with a second slope for 180°<θ<360°, but with the first and second slope being opposite to the first slope m or the second slope n, respectively, for the azimuthal section of the polarization-optical element. Again, a tangential polarization distribution can be achieved with half the slope of the lines E1, E2 describing the inclined surface of the polarization-modulating element (or F1, F2 describing the inclined surface of the compensation plate) if compared to FIG. 4e. Accordingly, the absolute value of the slopes of lines E1 or E2, respectively, are at a distance r from the element axis |m|=180°/(2·α·π·r) and |n|=180°/(2·α·π·r).

Various embodiments for a polarization-modulating optical element or for the optical systems according to the present invention are described in this application. Further, also additional embodiments of polarization-modulating optical elements or optical systems according to the present invention may be obtained by exchanging and/or combining individual features and/or characteristics of the individual embodiments described in the present application.

The invention claimed is:

1. A polarization transforming element for forming a selected polarization distribution for an incident predetermined light intensity distribution, comprising:
   a sector-shaped first basic element made of a first optical material with optical activity, for forming a first region of the polarization distribution and preserving the intensity distribution of the predetermined light intensity distribution in the first region; and
   a sector-shaped second basic element made of a second optical material with optical activity, for forming a second region of the polarization profile and preserving the intensity distribution of the predetermined light intensity distribution in the second region,
   wherein the first basic element and the second basic element have their respective thicknesses different from each other along a direction of transmission of light and the first and second optical materials each have an optic axis oriented parallel to the direction of transmission of light where each optical material rotates an electric field direction of linearly polarized light propagating along the optic axis by an amount proportional to a thickness of the optical material.

2. The polarization transforming element according to claim 1, wherein the thickness of the first basic element and the thickness of the second basic element are so set that with incidence of linearly polarized light a direction of polarization of linearly polarized light forming the first region is different from a direction of polarization of linearly polarized light forming the second region.

3. The polarization transforming element according to claim 2, wherein the first region of the polarization distribution and the second region distribution are positioned in at least a part of a predetermined annular region, which is a predetermined annular region centered around a predetermined point on a predetermined surface, and wherein beams passing through the first region of the polarization distribution and through the second region of the polarization distribution have a polarization state in which a principal component is linearly polarized light having a direction of polarization along a circumferential direction of the predetermined annular region.

4. The polarization transforming element according to claim 3, wherein the predetermined light intensity distribution has a contour of a shape substantially identical with the predetermined annular region,
   wherein the polarization state of the light passing through the first region has a linear polarization component substantially coincident with a tangential direction to a circle centered around the predetermined point, at a central position along a circumferential direction of the first region, and
   wherein the polarization state of the beam passing through the second region distribution has a linear polarization component substantially coincident with a tangential direction to a circle centered around the predetermined point, at a central position along a circumferential direction of the second region.

5. The polarization transforming element according to claim 3, wherein the first basic element and the second basic element are integrally formed.

6. The polarization transforming element according to claim 3, the beam transforming element being used in an illumination optical apparatus for illuminating a surface to be illuminated, based on a beam from a light source, wherein the polarization transforming element is positioned on or near an illumination pupil of the illumination optical apparatus.

7. The polarization transforming element according to claim 1, wherein the first basic element and the second basic element are made of crystalline quartz.

8. The polarization transforming element according to claim 1, wherein the first basic element and the second basic element are integrally formed.

9. The polarization transforming element according to claim 8, the beam transforming element being used in an illumination optical apparatus for illuminating a surface to be illuminated, based on a beam from a light source, wherein the polarizing transforming element is positioned on or near an illumination pupil of the illumination optical apparatus.

10. An illumination optical apparatus for illuminating a surface to be illuminated, based on a beam from a light source, comprising:
the polarization transforming element as defined in claim 1, for transforming the beam from the light source in order to form the selected polarization distribution of an illumination pupil distribution and being positioned on or near an illumination pupil of the illumination optical apparatus.

11. The illumination optical apparatus according to claim 10, wherein the polarization state of the beam from the polarization transforming element is so set that light illuminating the surface to be illuminated is in a polarization state in which a principal component is s-polarized light.

12. An exposure apparatus comprising the illumination optical apparatus as defined in claim 10, for illuminating a predetermined pattern, wherein a predetermined pattern is projected onto a photosensitive substrate.

13. An exposure method comprising an illumination step of illuminating a predetermined pattern by use of the illumination optical apparatus as defined in claim 10, and an exposure step of projecting a pattern of the predetermined pattern onto a photosensitive substrate.

14. A device manufacturing method comprising an illumination step of illuminating a predetermined pattern by use of the illumination optical apparatus as defined in claim 10, an exposure step of projecting the pattern onto a photosensitive substrate, and developing step for developing the photosensitive substrate.

15. The device manufacturing method according to claim 14, wherein the polarization state of the beam from the beam transforming element is so set that light illuminating the photosensitive substrate is in a polarization state in which a principal component is s-polarized light.

16. An illumination optical apparatus for illuminating a surface to be illuminated, based on a beam from a light source, comprising: the polarization transforming element as defined in claim 10, for transforming the beam from the light source in order to form the selected polarization distribution, and wherein the polarization transforming element is positioned on or near an illumination pupil of the illumination optical apparatus.

17. An exposure apparatus comprising the illumination optical apparatus as defined in claim 16, for illuminating a predetermined pattern, wherein the predetermined pattern is projected onto a photosensitive substrate.

18. The exposure apparatus according to claim 17, wherein the polarization state of the beam from the polarization transforming element is so set that light illuminating the photosensitive substrate is in a polarization state in which a principal component is s-polarized light.

19. An exposure method comprising an illumination step of illuminating a predetermined pattern by use of the illumination optical apparatus as defined in claim 16, and an exposure step of projecting a pattern of the predetermined pattern onto a photosensitive substrate.

20. The exposure method according to claim 19, wherein the polarization state of the beam from the polarization transforming element is so set that light illuminating the photosensitive substrate is in a polarization state in which a principal component is s-polarized light.

21. A device manufacturing method comprising an illumination step of illuminating a predetermined pattern by use of the illumination optical apparatus as defined in claim 16, an exposure step of projecting the pattern onto a photosensitive substrate, and developing step for developing the photosensitive substrate.

22. The device manufacturing method according to claim 21, wherein the polarization state of the beam from the polarization transforming element is so set that light illuminating the photosensitive substrate is in a polarization state in which a principal component is s-polarized light.

23. The illumination optical apparatus of claim 10, further comprising one or more optical elements arranged to direct radiation from the light source to the surface to be illuminated during operation of the apparatus, the one or more optical elements defining the illumination pupil between the light source and the surface to be illuminated, wherein the polarization transforming element is arranged at the illumination pupil.

24. The polarization transforming element of claim 1, wherein the polarization transforming element is a cylindrical element and the first and second basic elements correspond to different azimuthal sections of the cylindrical element.

* * * * *

UNITED STATES PATENT AND TRADEMARK OFFICE
CERTIFICATE OF CORRECTION

PATENT NO. : 8,482,717 B2  
APPLICATION NO. : 12/201767  
DATED : July 9, 2013  
INVENTOR(S) : Damian Fiolka and Markus Deguenther Page 1 of 1

It is certified that error appears in the above-identified patent and that said Letters Patent is hereby corrected as shown below:

In the Claims:

Column 38
Line 33, after "region" delete "distribution"
Line 54, after "region" delete "distribution"

Signed and Sealed this
Seventeenth Day of September, 2013

Teresa Stanek Rea
*Deputy Director of the United StatesPatent and Trademark Office*